(12) United States Patent
Kodama et al.

(10) Patent No.: US 9,507,263 B2
(45) Date of Patent: Nov. 29, 2016

(54) UNDERLAY FILM COMPOSITION FOR IMPRINTS AND METHOD OF FORMING PATTERN AND PATTERN FORMATION METHOD USING THE SAME

(71) Applicant: FUJIFILM Corporation, Minato-ku, Tokyo (JP)

(72) Inventors: Kunihiko Kodama, Haibara-gun (JP); Shinji Tarutani, Haibara-gun (JP); Yuichiro Enomoto, Haibara-gun (JP); Tadashi Oomatsu, Haibara-gun (JP); Takayuki Ito, Haibara-gun (JP); Hirotaka Kitagawa, Haibara-gun (JP); Akiko Hattori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 311 days.

(21) Appl. No.: 14/245,491

(22) Filed: Apr. 4, 2014

(65) Prior Publication Data

US 2014/0220353 A1 Aug. 7, 2014

Related U.S. Application Data

(63) Continuation of application No. PCT/JP2012/077013, filed on Oct. 5, 2012.

(60) Provisional application No. 61/544,806, filed on Oct. 7, 2011.

(30) Foreign Application Priority Data

Oct. 7, 2011 (JP) .................................. 2011-223031
Sep. 4, 2012 (JP) .................................. 2012-193857

(51) Int. Cl.
G03F 7/00 (2006.01)
G03F 7/09 (2006.01)

(52) U.S. Cl.
CPC ........ G03F 7/094 (2013.01); Y10T 428/31504 (2015.04)

(58) Field of Classification Search
CPC ............................. G03F 7/094; G03F 7/0002
See application file for complete search history.

(56) References Cited

U.S. PATENT DOCUMENTS

| | | | |
|---|---|---|---|
| 5,032,108 A | 7/1991 | Taniguchi et al. | |
| 5,169,965 A | 12/1992 | Fujiwa et al. | |
| 5,198,509 A | 3/1993 | Fujiwa et al. | |
| 5,338,879 A | 8/1994 | Fujiwa et al. | |
| 5,378,736 A | 1/1995 | Fujiwa et al. | |
| 7,598,014 B2 | 10/2009 | Washio et al. | |
| 2007/0105037 A1 | 5/2007 | Washio et al. | |
| 2009/0317608 A1* | 12/2009 | Furukawa ............. | G03F 7/0757 428/195.1 |
| 2013/0032971 A1* | 2/2013 | Omatsu et al. ........ | B82Y 10/00 264/293 |

FOREIGN PATENT DOCUMENTS

| | | |
|---|---|---|
| JP | 11-100378 A | 4/1999 |
| JP | 2906245 B2 | 6/1999 |
| JP | 2926262 B2 | 7/1999 |
| JP | 2008-105414 A | 5/2008 |
| JP | 2009-503139 A | 1/2009 |
| JP | 2010-157613 A | 7/2010 |
| JP | 2011-508680 A | 3/2011 |
| JP | 2011-168003 A | 9/2011 |
| TW | 1294556 B | 3/2008 |
| WO | 2007/050133 A2 | 5/2007 |
| WO | 2008/127835 A1 | 10/2008 |
| WO | 2009/085090 A1 | 7/2009 |
| WO | 2010/116594 A1 | 10/2010 |

OTHER PUBLICATIONS

Alfred Hassner "Small Ring Heterocycles, Part 3, Oxiranes, Arene Oxides, Oxaziridines, Dioxetanes, Thietanes, Thietes, Thiazetes, and Others", John Wiley and Sons, 1985, 199 pgs.
Yoshimura, Adhesive 1985, pp. 32-39, vol. 29, No. 12.
Yoshimura, Adhesive 1986, pp. 42-47, vol. 30, No. 5.
Yoshimura, Adhesive 1986, pp. 42-47, vol. 30, No. 7.
M. Colburn et al., "Step and Flash Imprint Lithography: A New Approach to High-Resolution Patterning", SPIE, Mar. 1999, pp. 379-389, vol. 3676.
Lecture of Experimental Chemistry 20, 4th Ed., Organic Synthesis II, p. 213, ff. (Maruzen, 1992).
Stephen C. Lapin, "Vinyl Ether Functionalized Urethane Oligomers: An Alternative to Acrylate Based Systems", Polymers Paint Colour Journal, Jul. 1989, pp. 321-328, vol. 179, No. 4237.
Gun-Young Jung et al., "Improved Pattern Transfer in Nanoimprint Lithography at 30 nm Half-Pitch by Substrate-Surface Functionalization", Langmuir 2005, pp. 6127-6130, vol. 21.
Stephen Y. Chou et al., "Imprint of sub-25 nm vias and trenches in polymers". App. Phys. Lett., Nov. 1995, pp. 3114-3116, vol. 67, No. 21.
International Search Report for PCT/JP2012/077013 dated Jan. 22, 2013.
Written Opinion for PCT/JP2012/077013 dated Jan. 22, 2013.
Office Action dated Mar. 10, 2015 from the Japanese Patent Office in counterpart JP Application No. 2012-193857.
Toagosei("http://www.toagosei.co.jp/products/acryl/catalog/pdf/index_pdf_03.pdf") pp. 1-24, Apr. 2011.

(Continued)

Primary Examiner — Nathan M Nutter
(74) Attorney, Agent, or Firm — Sughrue Mion, PLLC

(57) ABSTRACT

Provided is the pattern formability and line edge roughness of the resultant substrate.
An underlay film composition for imprints comprising a compound (A) and a solvent (B), the compound (A) having at least either one of a group (Ka) capable of covalently bonding and/or interacting with a substrate, and, a group (Kb) capable of covalently bonding and/or interacting with a curable composition for imprints, an Ohnishi parameter (Z) calculated from (equation 1) of 3.8 or larger, and a molecular weight of 400 or larger:

the Ohnishi parameter=(total number of atoms)/
(number of carbon atoms−number of oxygen
atoms). (Equation 1)

11 Claims, 1 Drawing Sheet

(56) References Cited

OTHER PUBLICATIONS

International Preliminary Report on Patentability mailed Apr. 17, 2014 for International Application No. PCT/JP2012/077013.
Written Opinion of the International Searching Authority mailed Jan. 22, 2013 for International Application No. PCT/JP2012/077013.
F.A. Houle et al., "Adhesion between template materials and UV-cured nanoimprint resists", J. Vac. Sci. Technol. B, pp. 1179-1185, Jul./Aug 2007, vol. 25, No. 4.
Office Action dated Aug. 22, 2016, issued by the Intellectual Property Office of Taiwan in corresponding Taiwanese Application No. 101136776.

* cited by examiner

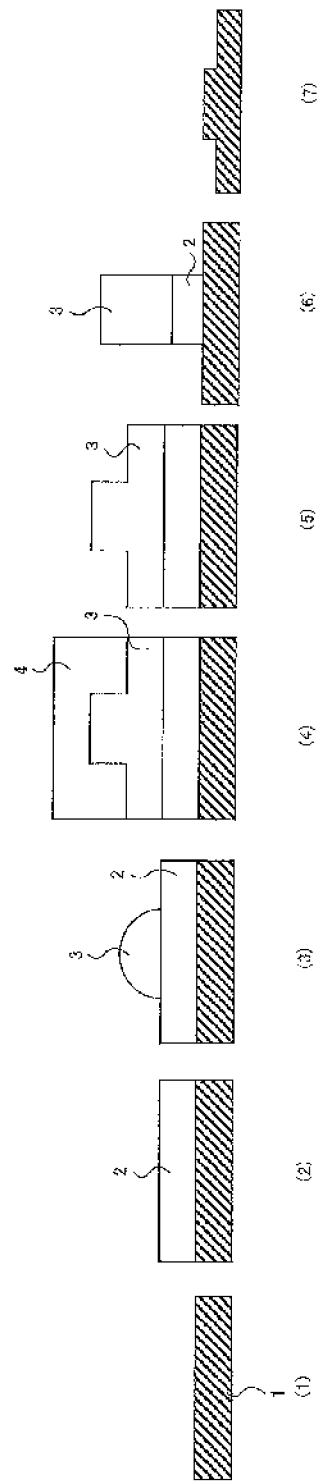

UNDERLAY FILM COMPOSITION FOR IMPRINTS AND METHOD OF FORMING PATTERN AND PATTERN FORMATION METHOD USING THE SAME

CROSS-REFERENCE TO RELATED APPLICATIONS

The present application is a continuation of PCT/JP2012/077013 filed on Oct. 5, 2012 and claims priority under 35 U.S.C. §119 of Japanese Patent Application Nos. 223031/2011 filed on Oct. 7, 2011 and 193857/2012 filed on Sep. 4, 2012, and U.S. provisional application No. 61/544,806 filed on Oct. 7, 2011.

TECHNICAL FIELD

The present invention relates to an underlay film composition for imprints disposed between a substrate and a curable composition for imprints. The present invention also relates to a pattern formation method using the underlay film composition for imprints. The present invention also relates to a method of manufacturing a device using the pattern formation method. The present invention furthermore relates to a stacked article using the underlay film composition for imprints, and a device having the stacked article.

In more details, the present invention relates to an underlay film composition for imprints, which are used for forming micropatterns by photoirradiation, and are used for manufacturing semiconductor integrated circuit; flat screen; microelectro-mechanical system (MEMS); sensor device; optical disk; magnetic recording media such as high density memory disk; optical components such as grating and relief hologram; nanodevice; optical device; optical film and polarizing device for manufacturing flat panel display; thin film transistor, organic transistor, color filter, overcoat layer, pillar component, rib component for aligning liquid crystal for liquid crystal display; microlens array; immunoassay chip; DNA chip; microreactor; nanobio device, optical waveguide; optical filter; photonic liquid crystal; and mold for imprints.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photo-curable composition (for example, see M. Colbun, at al., Proc. SPIE, Vol. 3676, 379 (1999)). In the thermal nanoimprint method, a mold is pressed against a polymer resin heated up to a temperature higher than the glass transition temperature thereof, then the resin is cooled and thereafter released from the mold to thereby transfer the microstructure of the mold onto the resin on a substrate. The method is applicable to various resin materials and glass materials and is expected to be applicable to various fields.

On the other hand, in the photonanoimprint method where a photo-curable composition is cured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc.

The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like.

In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As activities regarding the photonanoimprint method have increased, an issue of adhesiveness between a substrate and a curable composition for imprints has been gaining more attention. In more details, the curable composition for imprints is generally applied to the surface of the substrate to form a layer, and is cured by photoirradiation while being kept under a mold, but the curable composition for imprints may adhere onto the mold when the mold is separated thereafter. Poor separability of the mold may degrade formability of the resultant patterns. This is ascribable to a part of the curable composition for imprints remaining on the mold.

It has therefore been demanded to improve adhesiveness between the substrate and the curable composition for imprints. Known techniques for enhancing the adhesiveness between the substrate and the curable composition for imprints are disclosed in R. S. Williams et al., *Langmuir* 21, 6127 (2005), Houle et al., *J. Vac. Sci. Technol.*, B 25(4), 1179 (2007), and Published Japanese Translation of PCT International Publication for Patent Application Nos. 2009-503139 and 2011-508680. More specifically, according to R. S. Williams et al., *Langmuir* 21, 6127 (2005), Houle et al., *J. Vac. Sci. Technol.*, B 25(4), 1179 (2007), and Published Japanese Translation of PCT International Publication for Patent Application Nos. 2009-503139, the adhesiveness between the substrate and the curable composition for imprints is improved by using a polymerizable compound having a group interactive with the substrate. On the other hand, according to Published Japanese Translation of PCT International Publication for Patent Application Nos. 2009-503139 and 2009-503139, the adhesiveness between the substrate and the curable composition for imprints is improved by using an addition condensation polymer having a polymerizable group.

SUMMARY OF THE INVENTION

The present inventors found, from our investigations into the prior art, that use of the curable composition for imprints for the purpose of working of the substrate typically by etching only degraded pattern formability and line edge roughness of the substrate. It is therefore an object of the present invention to solve the above-described problems, and is to provide an underlay film composition for imprints capable of improving the adhesiveness between the substrate and the curable composition for imprints, and is capable of ensuring excellent pattern formability and line edge roughness of the substrate when the curable composition for imprints is used for working by etching of the substrate.

In this situation, the present inventors found out from our extensive investigations that Onishi's parameter (Z) of the compound (A) used for the underlay film composition largely affects the pattern formability and line edge roughness of the resultant substrate. In other words, the present inventors found out that the above-described problems may be solved by using, as the underlay film composition, the compound (A) and so forth having a specific value of the Ohnishi parameter (Z) calculable from the equation (1), and the finding led us to complete the present invention.

More specifically, the above-described problems were solved by embodiment <1> below, and preferably by embodiments <2> to <22>.

<1> An underlay film composition for imprints comprising a compound (A) and a solvent (B), the compound (A) having at least either one of a group (Ka) capable of covalently bonding and/or interacting with a substrate, and, a group (Kb) capable of covalently bonding and/or interacting with a curable composition for imprints, an Ohnishi parameter (Z) calculated from (equation 1) of 3.8 or larger, and a molecular weight of 400 or larger:

the Ohnishi parameter=(total number of atoms)/(number of carbon atoms−number of oxygen atoms)  (Equation 1)

<2> The underlay film composition for imprints of <1>, wherein the ratio of a sum (Za) of products of the Ohnishi parameters of the individual components and the mass fractions thereof, with respect to the whole components excluding the solvent (B), is 3.8 or larger.

<3> The underlay film composition for imprints of <1> or <2>, wherein the underlay film composition for imprints contains a compound (Aa) having a group (Ka) capable of covalently bonding and/or interacting with the substrate, and a compound (Ab) having a group (Kb) capable of covalently bonding and/or interacting with the curable composition for imprints; or contains a compound (Aab) having a group (Ka) capable of covalently bonding and/or interacting with the substrate, and having a group (Kb) capable of covalently bonding and/or interacting with the curable composition for imprints.

<4> The underlay film composition for imprints of any one of <1> to <3>, wherein the compound (A) is a polymer having a molecular weight of 3000 or larger.

<5> The underlay film composition for imprints of any one of <1> to <4>, wherein the compound (A) is an addition polymerization-type polymer having a molecular weight of 3000 or larger.

<6> The underlay film composition for imprints of any one of <1> to <5>, wherein the group (Kb) capable of covalently bonding and/or interacting with the curable composition for imprints, bound to the compound (A), is a (meth)acryloyl group.

<7> The underlay film composition for imprints of any one of <1> to <6>, wherein the group (Ka) capable of covalently bonding and/or interacting with the substrate, bound to the compound (A), is selected from carboxyl group, hydroxy group and ether group.

<8> The underlay film composition for imprints of any one of <1> to <7>, wherein the compound (A) has substantially no aromatic group.

<9> The underlay film composition for imprints of any one of <1> to <8>, wherein the underlay film composition for imprints is substantially composed of the compound (A) and the solvent (B) only.

<10> The underlay film composition for imprints of any one of <1> to <9>, wherein the curable composition for imprints contains a polymerizable compound (C), and the Ohnishi parameter (Y) of the polymerizable compound (C) and the Ohnishi parameter (Z) of the compound (A) satisfy (Y)≤(Z).

<11> The underlay film composition for imprints of any one of <1> to <10>, wherein the curable composition for imprints contains a polymerizable compound (C), and the Ohnishi parameter (Y) of the polymerizable compound, and a sum (Za) of products of the Ohnishi parameters of the individual components and the mass fraction thereof, with respect to the whole components excluding the solvent of the underlay film composition for imprints, satisfy (Y)≤(Za).

<12> A pattern formation method comprising:
  forming an underlay film by applying, onto the surface of a substrate, the underlay film composition for imprints described in any one of <1> to <11>;
  applying, onto the surface of the underlay film or the surface of a mold having a micropattern formed thereon, a curable composition for imprints containing a polymerizable compound (C);
  curing the curable composition for imprints, while holding the curable composition for imprints between the underlay film and the mold having the micropattern formed thereon; and
  releasing the mold.

<13> The pattern formation method of <12>, wherein the Ohnishi parameter (Y) of the polymerizable compound (C), and the Ohnishi parameter (Z) of the compound (A) satisfy (Y)≤(Z).

<14> The pattern formation method of <12>, wherein the Ohnishi parameter (Y) of the polymerizable compound (C), and a sum (Za) of products of the Ohnishi parameters of the individual components and the mass fraction thereof, with respect to the whole components excluding the solvent of the underlay film composition for imprints, satisfy (Y)≤(Za).

<15> The pattern formation method of <13>, wherein the Ohnishi parameter (Y) of the polymerizable compound (C), and a sum (Za) of products of the Ohnishi parameters of the individual components and the mass fraction thereof, with respect to the whole components excluding the solvent of the underlay film composition for imprints, satisfy (Y)+0.2≤(Za).

<16> The pattern formation method of any one of <12> to <15>, wherein the polymerizable compound (C) has an aromatic group and/or alicyclic hydrocarbon group.

<17> A method of manufacturing a device comprising etching a substrate, by using as a mask, a pattern obtained by the pattern formation method described in any one of <12> to <16>.

<18> A stacked article comprising a substrate and an underlay film, the underlay film being formed by applying, on the substrate, the underlay film composition for imprints described in any one of <1> to <11>.

<19> A stacked article comprising a substrate, an underlay film provided on the surface of the substrate and composed of an underlay film composition for imprints, and a pattern forming layer obtained by curing a curable composition for imprints provided on the surface of the underlay film, the curable composition for imprints containing a polymerizable compound (C), and the Ohnishi parameter (Y) of the polymerizable compound (C), and a sum (Za) of products of the Ohnishi parameters of the individual components and the mass fraction thereof, with respect to the whole components excluding the solvent of the underlay film composition for imprints, satisfy (Y)≤(Za).

<20> The stacked article of <19>, wherein the underlay film composition for imprints is the underlay film composition for imprints described in any one of <1> to <11>.

<21> The stacked article of <19> or <20>, wherein the curable composition for imprints contains a polymerizable compound (C) having an aromatic group and/or an alicyclic hydrocarbon group.

<22> A device comprising the stacked article described in any one of <19> to <21>.

By virtue or the present invention, it became possible to improve the pattern formability and line edge roughness of the resultant substrate, when the curable composition for imprints is used for working by etching of the substrate.

BRIEF DESCRIPTION OF THE DRAWINGS

FIG. 1 is a drawing illustrating an exemplary manufacturing process when the curable composition for imprints is used for working by etching of the substrate.
1 substrate, 2 underlay film, 3 curable composition for imprints, 4 mold

MODES FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The underlay film composition for imprints of the present invention (which may simply be referred to as "underlay film composition", hereinafter) contains a compound (A) and a solvent (B). The compound (A) has at least either one of a group (Ka) capable of covalently bonding and/or interacting with a substrate, and, a group (Kb) capable of covalently bonding and/or interacting with a curable composition for imprints, an Ohnishi parameter (Z) calculated from (equation 1) of 3.8 or larger, and a molecular weight of 400 or larger:

Ohnishi parameter=(total number of atoms)/(number of carbon atoms−number of oxygen atoms).  (Equation 1)

The "group capable of interacting with something" herein means a group capable of attracting something by electrostatic interaction, hydrogen bond, van der Waals interaction, which are ascribable to coulomb force, orientation force or induction force. In the present invention, Ka is preferably an interactive group, and Kb is preferably a covalently bondable group.

The underlay film composition of the present invention may contain, as the compound (A), at least one of (Aa), (Ab), and (Aab) listed below, and may contain two or more of them. For the case where two or more species of the compound (A) are contained, the value of Ohnishi parameter (Z) is calculated as a sum of products of values of the Ohnishi parameter (Z) and mass fraction of the individual compounds.

(Aa): a compound having a group (Ka) capable of covalently bonding and/or interacting with a substrate (which may simply be referred to as "Ka", hereinafter), and, an Ohnishi parameter (Z) of 3.8 or larger, and, a molecular weight of 400 or larger;

(Ab): a compound having a group (Kb) capable of covalently bonding and/or interacting with the curable composition for imprints (Kb) (which may simply be referred to as "Kb"), and, an Ohnishi parameter (Z) of 3.8 or larger, and, a molecular weight of 400 or larger; and (Aab): a compound having a group Ka and a group Kb, and, an Ohnishi parameter (Z) of 3.8 or larger, and, a molecular weight of 400 or larger.

The underlay film composition preferably contains at least both of (Aa) and (Ab), and, at least (Aab), and more preferably contains at least (Aab). When the underlay film composition contains at least (Aab), the effect of the present invention is more likely to be expressed in an effective manner.

The compounds (Aa), (Ab), and (Aab) may be contained alone, or two or more species of them may be contained in combination. The underlay film composition of the present invention may contain a compound having at least either one of the group Ka and group Kb, other than the compounds (Aa), (Ab) and (Aab). The compound (A'), in this case, having at least either one of the group Ka and group Kb preferably has a total content of the compounds (Aa), (Ab) and (Aab) of 50% by mass or more, more preferably 70% by mass or more, and still more preferably 90% by mass or more.

In the present invention, it is preferable that the underlay film composition is substantially composed of the compound (A') having at least either one of the group Ka and group Kb, and the solvent only. "Substantially" herein means that there is no other component contained therein up to a level affective to the effect of the present invention, and typically means that the content of other component is 2% by mass or less of the total.

The group Ka is preferably a hydrolyzable silyl group (for example, alkoxysilyl group, and halogen-substituted silyl group), or a polar functional group. Specific examples of the polar functional group include alcoholic hydroxy group, phenolic hydroxy group, carboxyl group, amide group, imide group, urea group, urethane group, cyano group, ether group (preferably polyalkylenoxy group), cyclic ether group, lactone group, sulfonamide group, sulfonimide group, phosphate group, and sulfonate group. Among them, more preferable examples include alcoholic hydroxy group, carboxyl group, cyano group, ether group, cyclic ether group, and lactone group, and still more preferable examples include alcoholic hydroxy group, carboxyl group, and ether group.

The group Kb is preferably a group capable of covalently bonding with the curable composition for imprints, and more preferably a group polymerizable with a polymerizable compound (C) contained in the curable composition for imprints. The group Kb is still more preferably an ethylenic unsaturated group or cyclic ether group, and particularly the ethylenic unsaturated group. Examples of the ethylenic unsaturated group include (meth)acryloyl group, maleimide group, allyl group, and vinylphenyl group, and more preferable examples include (meth)acryloyl group. Examples of the cyclic ether group include epoxy group and oxetanyl group, and among them, epoxy group is preferable. Among these groups, (meth)acryloyl group is most preferable.

The compound (Aab) having the group Ka and group Kb is a compound having both of the group Ka and group Kb in the molecule thereof, and preferably a compound having a functional group suitable for the group Ka, and a functional group suitable for the group Kb.

The compound (A) has an Ohnishi parameter (Z), calculable from the (equation 1), of 3.8 or larger, more preferably 4.0 or larger, still more preferably 4.5 or larger, and most preferably 5.0 or larger.

While the upper limit value of the Ohnishi parameter is not specifically limited, it may be adjusted to 20 or smaller, for example.

For the case where the compound (A) used in the present invention is a polymer having a plurality of repeating units, the Ohnishi parameter (Z) may be calculated as the sum of products of values of the Ohnishi parameter of the individual repeating units, and mass fraction of the repeating units. The compound (A) preferably has a small content of the aromatic group in order to increase the Ohnishi parameter. As for the polymer, the content of the repeating unit having the aromatic group is preferably 50 mol % or less, more preferably 30 mol % or less, and still more preferably 10 mol % or less. It is particularly preferable that the polymer contains substantially no aromatic group. For the case where the underlay film composition of the present invention contains two or more species of the compound (A), it is preferable that at least one species contains substantially no aromatic group, and it is more preferable that all species contain substantially no aromatic group.

"Substantially" herein means that there is no other component contained therein up to a level affective to the effect of the present invention, and typically means that the amount of addition of a compound having aromatic group is 1% by mass or less of the total amount of addition of the compound (A).

The compound (A) is a compound having a molecular weight of 400 or larger, may be a low molecular weight compound or a polymer, and more preferably a polymer. The molecular weight of the compound (A) is 400 or larger, preferably 1000 or larger, more preferably 3000 or larger, still more preferably 5000 or larger, and particularly 10000 or larger. The upper limit value of the molecular weight is preferably 200000 or smaller, more preferably 100000 or smaller, and still more preferably 50000 or smaller. By adjusting the molecular weight to 400 or larger, the components may be prevented from vaporizing, and by adjusting the molecular weight to 5000 or larger, surface quality of the coated film may be improved.

When the compound (A) is a polymer, the principal chain of the polymer is preferably of addition polymerization type or polyaddition type, and particularly of addition polymerization type.

The addition polymerization-type polymer is obtained by allowing monomers having an ethylenic unsaturated bond to proceed radical polymerization, anionic polymerization, cationic polymerization, or coordination polymerization, and examples of basic structure of which include polystyrene, methyl polymethacrylate, polymethacrylic acid, polyacrylamide, polyvinylpyrrolidone, polyacrylonitrile, polyvinyl acetate, and polyvinyl alcohol.

The polyaddition-type polymer is obtained by sequential polymerization based on addition reaction, and the basic structure of which is exemplified by polyurethane.

Content of the compound (A) in the underlay film composition of the present invention is preferably 30% by mass or more relative to the whole components excluding the solvent, more preferably 50% by mass or more, and still more preferably 70% by mass or more.

The underlay film composition for imprints of the present invention may contain components other than the compound (A), as described in the above, where ratio of compound having an Ohnishi parameter of 3.8 or larger, with respect to the whole components excluding the solvent, is preferably 50% by mass or more, more preferably 70% by mass or more, and still more preferably 90% by mass or more.

In the underlay film composition of the present invention, a sum (Za) of products of the Ohnishi parameters of the individual components and the mass fraction thereof, with respect to the whole components excluding the solvent of the underlay film composition for imprints, is preferably 3.8 or larger, more preferably 4.0 or larger, still more preferably 4.5 or larger, and most preferably 5.0 or larger. While the upper limit value of Za is not specifically limited, it may be adjusted to 20 or smaller, for example.

The underlay film composition of the present invention contains the solvent (B). The solvent may be of any kind, so long as it can dissolve therein the underlay film composition. The solvent is preferably has a boiling point under normal pressure of 80 to 200° C., and more preferably has at least one of ester structure, ketone structure, hydroxy group, and ether structure. More specifically, the solvent is selected from propylene glycol monomethyl ether acetate, cyclohexanone, 2-heptanone, γ-butyrolactone, propylene glycol monomethyl ether, and ethyl lactate, which are used alone or in a mixed manner. From the viewpoint of uniformity in coating, it is particularly preferable that the solvent contains propylene glycol monomethyl ether acetate.

Content of the solvent (B) in the underlay film composition of the present invention is optimized depending on viscosity of the components excluding the solvent, coatability and desired thickness. From the viewpoint of improving the coatability, amount of addition of the solvent (B) is preferably 70% by mass or more of the whole components, more preferably 90% by mass or more, still more preferably 95% by mass or more, and furthermore preferably 99% by mass or more.

The underlay film composition of the present invention may contain, as the other components, crosslinking agent, surfactant, photo- or thermal polymerization initiator, and polymerization inhibitor. Amount of mixing of the other components is preferably 50% by mass of the whole components excluding the solvent.

Crosslinking Agent

The crosslinking agent is preferably a cation polymerizable compound such as epoxy compound, oxetane compound, methylol compound, methylol ether compound, and vinyl ether compound; or radical polymerizable compound such as (meth)acrylate compound, maleimide compound, and styryl compound.

The epoxy compound is exemplified by Epolite from Kyoeisha Chemical Co. Ltd.; Denacol EX from Nagase ChemteX Corporation; EOCN, EPPN, NC, BREN, GAN, GOT, AK, RE Series from Nippon Kayaku Co. Ltd.; Epicoat from Japan Epoxy Resins Co. Ltd.; Epicron from DIC Corporation; and Tepic from Nissan Chemical Industries, Ltd. Two or more species of these compounds may be used in combination.

Examples of the oxetane compound include Ethernacoll OXBP, OXTP and OXIPA from Ube Industries, Ltd.; and Arone oxetane OXT-121 and OXT-221 from Toagosei Co. Ltd.

Examples of the vinyl ether compound include Vectomer Series from Allied Signal.

Examples of the methylol compound and methylol ether compound include urea resin, glycolyl resin, melamine resin, guanamine resin, and phenolic resin. More specific examples include Nikalac MX-270, MX-280, MX-290, MW-390, BX-4000 from Sanwa Chemical Co. Ltd.; and Cymel 301, 303ULF, 350, 1123 from Cytec Industries Inc.

Examples of the vinyl ether compound include ethylene glycol divinyl ether, diethylene glycol divinyl ether, triethylene glycol divinyl ether, tetraethylene glycol divinyl ether, 1,2-propanediol divinyl ether, 1,4-butanediol divinyl ether, neopentyl glycol divinyl ether, hexanediol divinyl ether, trimethylolpropane trivinyl ether, trimethylolethane trivinyl ether, pentaerythritol tetravinyl ether, sorbitol tetravinyl ether, sorbitol pentavinyl ether, and bisphenol A divinyloxyethyl ether.

Examples of the (meth)acrylate compound include ethylene glycol di(meth)acrylate, propylene glycol di(meth)acrylate, 1,3-butanediol di(meth)acrylate, 1,4-butanediol di(meth)acrylate, neopentyl glycol di(meth)acrylate, 1,6-hexanediol di(meth)acrylate, 1,9-nonanediol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, EO-modified bisphenol A di(meth)acrylate, PO-modified bisphenol A di(meth)acrylate, EO-modified neopentyl glycol diacrylate, norbornane dimethanol di(meth)acrylate, dicyclopentane dimethanol di(meth)acrylate, tricyclodecane dimethanol di(meth)acrylate, glycerol di(meth)acrylate, glycerol tri(meth)acrylate, trimethylolpropane tri(meth)acrylate, pentaerythritol tetra(meth)acrylate, ditrimethylolpropane tetra(meth)acrylate, dipentaerythritol hexa(meth)acrylate, and tris(acryloxyethyl) isocyanurate.

A preferable combination is such that the compound (A) has a (meth)acrylate group, and the crosslinking agent is a (meth)acrylate compound.

Surfactant

The underlay film composition for imprints of the present invention preferably contains a surfactant. Content of the surfactant used in the present invention is typically 0.00001 to 5% by mass of the total composition, preferably 0.0001 to 2% by mass, and more preferably 0.005 to 1% by mass. When two or more species of surfactant are used, the total content falls in the above-described ranges. By adjusting the content of surfactant in the composition to 0.00001 to 5% by mass, a good effect of uniformity of coating may be obtained.

As the surfactant, preferred are nonionic surfactants. Preferably, the composition comprises at least one of a fluorine-containing surfactant, a silicone-type surfactant and a fluorine-containing silicone-type surfactant. More preferably, the composition comprises both a fluorine-containing surfactant and a silicone-type surfactant, or a fluorine-containing silicone-type surfactant. The most preferably, the composition comprises a fluorine-containing silicone-type surfactant. As the fluorine-containing surfactant and the silicone-type surfactant, preferred are nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A, F780F (DIC's trade names).

Examples of the fluorine-containing silicone-type surfactant include X-70-090, X-70-091, X-70-092, X-70-093 (Shin-Etsu Chemical's trade names); Megafac R-08, XRB-4 (DIC's trade names).

Thermal Polymerization Initiator

Particularly preferable examples of the thermal polymerization initiator preferably used herein include thermal radical initiator composed of organic peroxide or organic azo compound. Examples of the organic peroxide include ketone peroxides such as Perhexa H; peroxyketals such as Perhexa TMH; hydroperoxides such as Perbutyl H-69; dialkyl peroxides such as Percutiyl D, Perbutyl C, and Perbutyl D; diacyl peroxides such as Nyper BW; peroxyesters such as Perbutyl Z and Perbutyl L; peroxydicarbonates such as Perloyl TCP; all commercially available from NOF Corporation, diisobutyryl peroxide, cumylperoxyneodecanoate, di-n-propylperoxydicarbonate, diisopropylperoxydicarbonate, di-sec-butylperoxydicarbonate, 1,1,3,3-tetramethylbutylperoxyneodecanoate, di(4-tert-butylchlorohexyl)peroxydicarbonate, di(2-ethylhexyl)peroxydicarbonate, tert-hexylperoxyneodecanoate, tert-butylperoxyneodecanoate, tert-butylperoxyneoheptanoate, tert-hexylperoxypivalate, tert-butylperoxypivalate, di(3,5,5-trimethylhexanoyl) peroxide, dilauroyl peroxide, 1,1,3,3-tetramethylbutylperoxy-2-ethylhexanoate, disuccinic acid peroxide, 2,5-dimethyl-2,5-di(2-ethylhexanoylperoxy)hexane, tert-hexylperoxy-2-ethylhexanoate, di(4-methylbenzoyl) peroxide, tert-butylperoxy-2-ethylhexanoate, di(3-methylbenzoyl) peroxide, benzoyl(3-methylbenzoyl) peroxide, dibenzoyl peroxide, dibenzoyl peroxide, 1,1-di(tert-butylperoxy)-2-methylcyclohexane, 1,1-di(tert-hexylperoxy)-3,3,5-trimethylcyclohexane, 1,1-di(tert-hexylperoxy)cyclohexane, 1,1-di (tert-butylperoxy)cyclohexane, 2,2-di(4,4-di-(tert-butylperoxy)cyclohexyl)propane, tert-hexylperoxyisopropylmonocarbonate, tert-butylperoxymaleic acid, tert-butylperoxy-3,5,5-trimethylhexanoate, tert-butylperoxylaurate, tert-butylperoxyisopropylmonocarbonate, tert-butylperoxy-2-ethylhexylmonocarbonate, tert-hexylperoxybenzoate, 2,5-dimethyl-2,5-di(benzoylperoxy)hexane, tert-butylperoxyacetate, 2,2-di(tert-butylperoxy)butane, tert-butylperoxybenzoate, n-butyl-4,4-di-tert-butylperoxyvalerate, di(2-tert-butylperoxyisopropyl) benzene, dicumyl peroxide, di-tert-hexyl peroxide, 2,5-dimethyl-2,5-di(tert-butylperoxy)hexane, tert-butylcumyl peroxide, di-tert-butyl peroxide, p-methanehydro peroxide, 2,5-dimethyl-2,5-di(tert-butylperoxy)hexine-3, diisopropylbenzenehydro peroxide, 1,1,3,3-tetramethylbutylhydro peroxide, cumenehydro peroxide, tert-butylhydro peroxide, 2,3-dimethyl-2,3-diphenylbutane, 2,4-dichlorobenzoyl peroxide, o-chlorobenzoyl peroxide, p-chlorobenzoyl peroxide, tris(tert-butylperoxy)triazine, 2,4,4-trimethylpentylperoxyneodecanoate, α-cumylperoxyneodecanoate, tert-amylperoxy-2-ethylhexanoate, tert-butylperoxyisobutyrate, di-tert-butylperoxyhexahydro terephthalate, di-tert-butylperoxytrimethyl adipate, di-3-methoxybutylperoxydicarbonate, diisopropylperoxydicarbonate, tert-butylperoxyisopropylcarbonate, 1,6-bis(tert-butylperoxycarbonyloxy)hexane, diethylene glycol bis(tert-butylperoxycarbonate), tert-hexylperoxyneodecanoate, and Luperox 11 commercially available from Arkema Yoshitomi, Ltd.

As the organic azo compound, preferably used are azonitrile compounds such as V-30, V-40, V-59, V-60, V-65 and V-70; azoamide compounds such as VA-080, VA-085, VA-086, VF-096, VAm-110 and VAm-111; cyclic azoamizine compounds such as VA-044 and VA-061; azoamizine compounds such as V-50, VA-057; azoester compounds such as V-601 and V-401; all commercially available from Wako Pure Chemical Industries, Ltd., 2,2-azobis(4-methoxy-2,4-dimethylvaleronitrile), 2,2-azobis(2,4-dimethylvaleronitrile), 2,2-azobis(2-methylpropionitrile), 2,2-azobis(2,4-dimethylbutyronitrile), 1,1-azobis(cyclohexane-1-carbonitrile), 1-[(1-cyano-1-methylethyl)azo]formamide, 2,2-azobis{2-methyl-N-[1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis(N-butyl-2-methylpropionamide), 2,2-azobis(N-cyclohexyl-2-methylpropionamide), 2,2-azobis[2-(2-imidazoline-2-yl) propane]dihydrochloride, 2,2-azobis[2-(2-imidazoline-2-yl) propane]disulfate dihydrate, 2,2-azobis[2-[1-(2-hydroxyethyl)-2-imidazoline-2-yl]propane]dihydrochloride, 2,2-azobis[2-(2-imidazoline-2-yl)propane], 2,2-azobis (1-imino-1-pyrrolidino-2-methylpropane) dihydrochloride, 2,2-azobis(2-methylpropionamidine) dihydrochloride, 2,2-azobis[N-(2-carboxyethyl)-2-methylpropionamidine]tetrahydrate, dimethyl-2,2-azobis(2-methyl propionate), 4,4-azobis(4-cyanovaleric acid), and 2,2-azobis(2,4,4-trimethylpentane).

When the cation polymerizable compound is contained, the thermal acid generator is preferably used, and sulfonium salt is more preferably used, typically available under the trade name of San-Aid SI Series from Sanshin Chemical Industry Co. Ltd.

Amount of addition of the thermal polymerization initiator preferably used for the present invention is 0.1 to 5% by mass relative to the whole components of the underlay film composition.

Photo-Polymerization Initiator

The photo-polymerization initiator is exemplified by photo-radical initiator and photo-cationic initiator. Commercially available initiators may be adoptable to the radical photo-polymerization initiator in the present invention. Those described in paragraph [0091] in Japanese-A-2008-105414 may preferably be used. Among them, acetophenone-base compound, acylphosphine oxide-base compound, and oxime ester-base compound are preferable from the viewpoint of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy)phenyl]-2-hydroxy-2-methyl-1-propane-1-one, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from.

The dialkoxyacetophenone-base compound may preferably be exemplified by Irgacure (registered trademark) 651 (2,2-dimethoxy-1,2-diphenylethane-1-one) available from BASF GmbH.

The aminoacetophenone-base compound may preferably be exemplified by Irgacure (registered trademark) 369 (2-benzyl-2-dimethylamino-1-(4-morpholinophenyl) butanone-1), Irgacure (registered trademark) 379 (PG) (2-dimethylamino-2-(4-methylbenzyl)-1-(4-morpholine-4-yl-phenyl) butane-1-one), and Irgacure (registered trademark) 907 (2-methyl-1-[4-methylthiophenyl]-2-morpholinopropane-1-one), all of which are available from BASF GmbH.

The acylphosphine oxide-base compound may preferably be exemplified by Irgacure (registered trademark) 819 (bis (2,4,6-trimethylbenzoyl)-phenylphosphine oxide), Irgacure (registered trademark) 1800 (bis(2,6-dimethoxybenzoyl)-2,4,4-trimethyl-pentylphosphine oxide), Lucirin TPO (2,4,6-trimethylbenzoyldiphenylphosphine oxide), and Lucirin TPO-L (2,4,6-trimethylbenzoylphenylethoxyphosphine oxide), all of which are available from BASF GmbH.

The oxime ester-base compound may preferably be exemplified by Irgacure (registered trademark) OXE01 (1,2-octanedione,1-[4-(phenylthio)phenyl]-2-(O-benzoyloxime)), and Irgacure (registered trademark) OXE02 (ethanone,1-[9-ethyl-6-(2-methylbenzoyl)-9H-carbazole-3-yl]-1-(O-acetyloxime)), all of which are available from BASF GmbH.

The cation photo-polymerization initiator adoptable to the present invention is preferably sulfonium salt compound, iodonium salt compound, and oxime sulfonate compound, and may preferably be exemplified by 4-methylphenyl[4-(1-methylethyl) phenyliodonium tetrakis(pentafluorophenyl)borate (PI2074, from Rhodia), 4-methylphenyl[4-(2-methylpropyl)phenyliodonium hexafluorophophate (Irgacure 250), Irgacure PAG103, 108, 121 and 203 (from BASF GmbH).

Amount of addition of the photo-polymerization initiator used for the present invention is 0.1 to 5% by mass relative to the whole components of the underlay film composition.

Polymerization Inhibitor

The underlay film composition of the present invention further preferably contains a polymerization inhibitor.

The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities overtime can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

The polymerization inhibitor may be exemplified by hydroquinone, p-methoxyphenol, di-tert-butyl-p-cresol, pyrogallol, tert-butylcatechol, benzoquinone, 4,4'-thiobis (3-methyl-6-tert-butylphenol), 2,2'-methylenebis (4-methyl-6-tert-butylphenol), cerium (III) salt of N-nitrosophenyl hydroxylamine, phenothiazine, phenoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline; among which preferable examples include p-benzoquinone, 2,2,6,6-tetramethylpiperidine-1-oxyl, free radical, 4-hydroxy-2,2,6,6-tetramethylpiperidine-1-oxyl, free radical, and phenothiazine.

The underlay film composition of the present invention may be prepared by mixing the individual components described in the above. After mixing the individual components, the mixture is preferably filtered typically through a filter with a pore size of 0.003 μm to 5.0 μm. The filtration may be proceeded according to a multi-step scheme or may be repeated multiple times. The filtrate may be re-filtered. Examples of material for composing the filter used for the filtration include polyethylene resin, polypropylene resin, fluorine-containing resin, and nylon resin, although not specifically limited.

The underlay film composition of the present invention is applied onto the substrate to form an underlay film. Methods of application onto the substrate include dip coating, air knife coating, curtain coating, wire bar coating, gravure coating, extrusion coating, spin coating, slit scanning, and ink jet process, by which a coated film or liquid droplets are formed on the substrate. From the viewpoint of uniformity in film thickness, spin coating is preferable. The solvent is then dried off. Preferable drying temperature is 70° C. to 130° C. The drying is preferably followed by curing with the aid of activation energy (preferably heat and/or light). It is preferable to proceed the curing under heating at 150° C. to 250° C. The drying-off of the solvent and the curing may be proceeded at the same time.

Thickness of the underlay film composed of the composition of the present invention may vary depending on applications, and it falls in the range approximately from 0.1 nm to 100 nm, preferably from 0.5 to 20 nm, more preferably from 1 to 10 nm. The underlay film composition of the present invention may be coated multiple times. The obtained underlay film is preferably smooth as possible.

The substrate (base or support), on which the underlay film composition for imprints of the present invention, is coated is selectable depending on various applications, typically from quartz, glass, optical film, ceramic material, evaporated film, magnetic film, reflective film, metal substrates composed of Ni, Cu, Cr or Fe, paper, SOG (Spin On Glass), polymer substrates composed of polyester film, polycarbonate film, or polyimide film, TFT array substrate, electrode plates of PDP, glass or transparent plastic substrate, electro-conductive substrate made of ITO or metal, insulating substrate, and substrates used for manufacturing semiconductor devices composed of silicon, silicon nitride, polysilicon, silicon oxide or amorphous silicon, without special limitation. For the case where the substrate is intended to be etched, the substrate is preferably any of those used for manufacturing semiconductor devices.

Also geometry of the substrate is not specifically limited, and may be given in the form of sheet or roll. Also as described later, the substrate is selectable between light-transmissive and non-light-transmissive, depending on the combination with the mold or the like.

The underlay film composition of the present invention may be used in a particularly effective manner when the curable composition for imprints is worked by etching. FIG. 1 is a schematic drawing illustrating an exemplary process of manufacturing involving etching of the substrate, wherein reference numeral 1 denotes the substrate, 2 denotes the underlay film, 3 denotes the curable composition for imprints, and 4 denotes the mold. As seen in FIG. 1, the underlay film composition 2 is applied onto the surface of the substrate 1 (2), the curable composition for imprints 3 is applied onto the surface (3), and the mold is applied onto the surface (4). After photo-irradiation, the mold is separated (5). The etching is conducted conforming to the resultant pattern composed of the curable composition for imprints (6). The curable composition for imprints 3 and the underlay film composition 2 are then separated, to thereby obtain the substrate having a desired pattern formed therein (7). In this process, adhesiveness between the substrate 1 and the curable composition for imprints 3 is important, since poor adhesiveness prevents the pattern of the mold 4 from being exactly transferred. On the other hand, even if the adhesiveness is large, the pattern formability may adversely be affected unless the underlay film composition is readily removable. This is because the patterned portion of the curable composition for imprints is damaged by etching. The present invention succeeded in solving this problem, with the aid of the embodiments described in the above.

In the present invention, it is particularly preferable to apply the underlay film composition onto the substrate, by spin coating. After the application, the underlay film composition is preferably prebaked (preferably at 80 to 120° C., so as to vaporize the solvent), and then baked for curing (200° C. to 250° C.). The curable composition for imprints is preferably applied by inkjet process or spin coating.

Accordingly, the stacked article of the present invention, composed of the substrate, and the pattern formed by the underlay film for imprints and the curable composition for imprints, may be used as an etching resist. The substrate in this case may be exemplified by a silicon wafer having a film of $SiO_2$, silicon nitride or the like formed thereon. A plurality of substrates may be processed at the same time.

It is also preferable to use the article remained after removing the etching resist, as a mold for molding the curable composition for imprints.

The stacked article of the present invention, composed of the substrate, and the pattern formed by the underlay film for imprints and the curable composition for imprints, is useful as a permanent film to be remained in devices or structures, in its intact form, or in the form obtained after removal of the films remained in the recess, or in the form obtained after removal of the underlay film, since the stacked article is less likely to cause separation of film under variable environment or stress.

The curable composition for imprints used in combination with the underlay film composition of the present invention generally contains a polymerizable compound (C) and a polymerization initiator (D).

While species of the polymerizable compound used for the curable composition for imprints in the present invention is not specifically limited so long as it does not departs from the spirit of the present invention, preferable examples include polymerizable unsaturated monomer having 1 to 6 ethylenic unsaturated bond-containing group; epoxy compound and oxetane compound; vinyl ether compound; styrene derivative; and propenylether or butenyl ether. The curable composition for imprints preferably has a polymerizable group capable of polymerizing with a polymerizable group on the underlay film composition for imprints.

Polymerizable Compound (C)

The polymerizable unsaturated monomer having from 1 to 6 ethylenic unsaturated bond-having groups (mono- to hexa-functional polymerizable unsaturated monomer) is described below.

The polymerizable unsaturated monomer having one ethylenic unsaturated bond-having group (mono-functional polymerizable unsaturated monomer) includes concretely methyl(meth)acrylate, ethyl(meth)acrylate, butyl(meth)acrylate, N-vinyl pyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 4-hydroxybutyl (meth)acrylate, acrylic acid dimer, benzyl (meth)acrylate, 1- or 2-naphthyl(meth)acrylate, butoxyethyl (meth)acrylate, cetyl (meth)acrylate, ethyleneoxide-modified (hereinafter this may be referred to as "EO") cresol (meth)acrylate, dipropylene glycol (meth)acrylate, ethoxylated phenyl (meth)acrylate, isoamyl (meth)acrylate, cyclopentanyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, 2-phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tribromophenyl (meth)acrylate, EO-modified tribromophenyl (meth)acrylate, tridodecyl (meth)acrylate, p-isopropenylphenol, styrene, N-vinyl pyrrolidone, N-vinyl caprolactam.

Of the monofunctional polymerizable compounds having ethylenic unsaturated bond(s), monofunctional (meth)acrylate compound is preferably used in the present invention, from the viewpoint of photo-curability. The monofunctional (meth)acrylate compound may be exemplified by those previously exemplified as the monofunctional polymerizable compounds having ethylenic unsaturated bond(s).

As the other polymerizable compound, also preferred is a poly-functional polymerizable unsaturated monomer having two ethylenic unsaturated bond-containing groups.

Preferred examples of the di-functional polymerizable unsaturated monomer having two ethylenic unsaturated bond-containing groups for use in the present invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, polyethylene glycol-tetramethylene glycol) di(meth)acrylate, poly(propylene glycol-tetramethylene glycol) di(meth)acrylate, polyester (di) acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea, o-, m-, or p-Xylylene di(meth)acrylate, 1,3-adamantane diacrylate, norbornane dimethanol diacrylate, tricyclo decane dimethanol di(meth)acrylate.

Of those, especially preferred for use in the present invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, o-, m-, or p-, benzene di(meth)acrylate, o-, m-, or p-xylylene di(meth)aclyate, etc.

Examples of the poly-functional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the present invention are EO-modified glycerol tri (meth)acrylate, PO-modified glycerol tri(meth)acrylate, trimethylolpropane tri (meth)acrylate, EO-modified trimethylolpropane tri(meth) acrylate, PO-modified trimethylolpropane tri(meth)acrylate, dipentaerythritol hexa(meth)acrylate, pentaerythritol ethoxy-tetra(meth)acrylate, pentaerythritol tetra(meth)acrylate, etc.

Of the multi-functional polymerizable unsaturated monomers having two or more ethylenic unsaturated bonds, multi-functional (meth)acrylate is preferably used from the viewpoint of photo-curability. The multi-functional (meth) acrylate herein is a general term for the bifunctional (meth) acrylate and tri-functional or higher valency of (meth) acrylates. Specific examples of multi-functional (meth) acrylate includes those found among the above-exemplified multi-functional polymerizable unsaturated monomer having two ethylenic unsaturated bonds, and those found among the above-exemplified multi-functional polymerizable unsaturated monomers having three or more ethylenic unsaturated bonds.

The oxirane ring-containing compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-containing compound (epoxy compound) preferably used in the present invention include glycidyl ethers such as bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, and polypropylene glycol diglycidyl ether; polyglycidyl ethers of polyether polyol obtained by adding one or two species of alkylene oxide to an aliphatic polyhydric alcohol such as ethylene glycol, propylene glycol and glycerin; diglycidyl esters of aliphatic long-chain dibasic acids; monoglycidyl ethers of aliphatic higher alcohols; monoglycidyl ethers of phenol, cresol, butylphenol, or polyether alcohols obtained by adding alkylene oxide to these alcohols; and glycidyl esters of higher fatty acids.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Preferable examples of the glycidyl group-containing compound commercially available include UVR-6216 (from Union Carbide Corporation); Glycidol, AOEX24, Cyclomer A200, (all from Daicel Corporation), Epicoat 828, Epicoat 812, Epicoat 1031, Epicoat 872, Epicoat CT508 (all from Yuka Shell Epoxy K.K.); and KRM-2400, KRM-2410, KRM-2408, KRM-2490, KRM-2720, KRM-2750 (all from Adeka Corporation). These compounds may be used alone, or two or more species of them may be used in combination.

The production method for the oxirane ring-containing compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the polymerizable compound for use in the present invention, vinyl ether compounds also may be in the composition. Also vinyl ether compound may preferably be used as the polymerizable compound adoptable to the present invention. The vinyl ether compound is appropriately selectable from publicly known ones which include 2-ethylhexylvinyl ether, butanediol-1,4-divinyl ether, diethylene glycol monovinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylenevinyl ether, triethylene glycol diethylenevinyl ether, ethylene glycol dipropylenevinyl ether, triethylene glycol diethylenevinyl ether, trimethylolpropane triethylenevinyl ether, trimethylolpropane diethylenevinyl ether, pentaerythritol diethylenevinyl ether, pentaerythritol triethylenevinyl ether, pentaerythritol tetraethylenevinyl ether, 1,1,1-tris[4-(2-vinyloxyethoxy)phenyl]ethane, and bisphenol A divinyloxyethyl ether.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

Also styrene derivative is used as the polymerizable compound adoptable to the present invention. Examples of the styrene derivative include styrene, p-methylstyrene, p-methoxystyrene, β-methylstyrene, p-methyl-β-methylstyrene, α-methylstyrene, p-methoxy-β-methylstyrene, and p-hydroxystyrene.

The polymerizable compound adoptable to the present invention is preferably a polymerizable compound having an alicyclic hydrocarbon structure or aromatic group. By using the polymerizable compound having the alicyclic hydrocarbon structure or aromatic group as an etching resist for processing the substrate, the line edge roughness may be improved. A particularly distinctive effect may be obtained when a polyfunctional polymerizable monomer has the alicyclic hydrocarbon structure or aromatic group.

Examples of the polymerizable compound having the alicyclic hydrocarbon structure include monofunctional (meth)acrylate having the alicyclic hydrocarbon structure, such as isobornyl (meth)acrylate, dicyclopentanyl (meth)acrylate, dicyclopentanyloxyethyl (meth)acrylate, dicyclopentenyl (meth)acrylate, adamantyl (meth)acrylate, tricyclodecanyl (meth)acrylate, and tetracyclododecanyl (meth)acrylate; and multifunctional (meth)acrylate having the alicyclic hydrocarbon structure, such as tricyclodecane dimethanol di (meth)acrylate, and 1,3-adamantanediol di(meth)acrylate.

As the polymerizable monomer compound having an aromatic structure is preferably a mono-functional (meth)acrylate compound represented by the formula (I) or a poly-functional (meth)acrylate compound represented by the formula (II) as mentioned below.

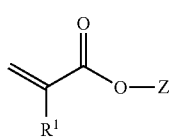
(I)

wherein Z is a group having an aromatic group; $R^1$ represents a hydrogen atom, an alkyl group, or a halogen atom.

$R^1$ is preferably a hydrogen atom, or an alkyl group, more preferably a hydrogen atom, or a methyl group, further more preferably a hydrogen atom from the viewpoint of the curability of the composition. Examples of the halogen atom include fluorine atom, chlorine atom, bromine atom, and iodine atom, and preferred is fluorine atom.

Z is an aralkyl group which may have a substituent, an aryl group which may have a substituent, or a group in which those groups are bonded to each other via a linking group. The linking group may include a hetero atom. The linking group is preferably —$CH_2$—, —O—, —C(=O)—, —S—, or a combination thereof. The aromatic group contained in Z is preferably a phenyl group or a naphthyl group. The molecular weight of Z is preferably 90 to 300, more preferably 120 to 250.

When the polymerizable monomer (I) is liquid at 25° C., the viscosity thereof is preferably 2 to 500 mPa·s at 25° C., more preferably 3 to 200 mPa·s, further more preferably 3 to 100 mPa·s. The polymerizable monomer (I) is preferably liquid at 25° C., or solid having a melting point of 60° C. or less, more preferably a melting point of 40° C. or less, further more preferably liquid at 25° C., or solid having a melting point of 25° C. or less.

Z preferably represents —$Z^1$—$Z^2$. $Z^1$ is a single bond, or a hydrocarbon group which may have a linking group containing a hetero atom in the chain thereof. $Z^2$ is an aromatic group which may have a substituent. $Z^2$ has a molecular weight of 90 or more.

$Z^1$ is more preferably an alkylene group not having a linking group containing a hetero atom in the chain thereof, more preferably a methylene group, or an ethylene group. Examples of the linking group containing a hetero atom include —O—, —C(=O)—, —S—, and a combination of an alkylene group and at least one of —O—, —C(=O)— and —S—. The number of the carbon atoms of $Z^1$ is preferably 1 to 3.

$Z^2$ is also preferably a group in which two or more aromatic groups directly bond to each other, or a group in which two or more aromatic groups bond to each other via a linking group. The linking group is preferably —$CH_2$—, —O—, —C(=O)—, —S—, or a combination thereof.

Examples of a substituent which the aromatic group may have include a halogen atom (fluorine atom, chlorine atom, bromo atom, iodine atom), a linear, a branched, or a cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxy group, an alkoxy group, an aryloxy group, an alkylthio group, an arylthio group, a heterocyclicoxy group, an acyloxy group, an amino group, a nitro group, a hydrazino group, a heterocyclic group. A group which is substituted with those groups is also preferred.

The amount of the polymerizable monomer represented by the formula (I) to be added in the curable composition for imprints is preferably 10 to 100% by mass, more preferably 20 to 100% by mass, further more preferably 30 to 80% by mass.

Of the compounds represented by the formula (I), specific examples of the compounds not having a substituent on the aromatic ring include benzyl (meth)acrylate, phenethyl (meth)acrylate, phenoxyethyl (meth)acrylate, 1- or 2-naphtyl (meth)acrylate, 1- or 2-naphtylmethyl (meth)acrylate, and 1- or 2-naphthylethyl (meth)acrylate.

Another preferable compound represented by the formula (I) is a compound having substituents on the aromatic ring thereof represented by the formula (I-1) below:

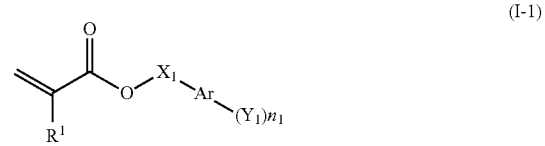
(I-1)

(In the formula (I-1), $R^1$ represents a hydrogen atom, alkyl group or halogen atom, $X^1$ represents a single bond or hydrocarbon group, and the hydrocarbon group may contain, in the chain thereof, a linking group having a hetero atom. $Y^1$ represents a substituent having a formula weight of 15 or larger, and n1 denotes an integer of 1 to 3. Ar represents an aromatic linking group, and is preferably a phenylene group or naphthylene group.)

$R^1$ is synonymous to $R^1$ in the formula in the above, specified by the same preferable ranges.

$X^1$ is synonymous to $Z^1$ in the above, specified by the same preferable ranges.

$Y^1$ is a substituent having a formula weight of 15 or larger, and is exemplified by alkyl group, alkoxy group, aryloxy group, aralkyl group, acyl group, alkoxycarbonyl group, alkylthio group, arylthio group, halogen atom, and cyano group. These substituents may have additional substituent(s).

When n1 is 2, $X^1$ is preferably a single bond or $C_1$ hydrocarbon group.

In a particularly preferable example, n1 is 1, and $X^1$ represents a $C_{1-3}$ alkylene group.

The compound represented by the formula (I-2) is more preferably a compound represented by either one of the formulae (I-2) and (I-3).

Compound Represented by Formula (I-2)

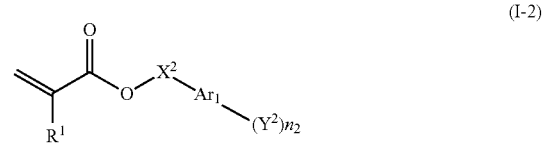
(I-2)

In the formula (I-2), $R^1$ represents a hydrogen atom, alkyl group or halogen atom. $X^2$ represents a single bond or hydrocarbon group, and the hydrocarbon group may contain, in the chain thereof, a linking group having therein a hetero atom. $Y^2$ represents a substituent having no aromatic group and having a formula weight of 15 or larger, and n2 denotes an integer of 1 to 3.

$R^1$ is synonymous to $R^1$ in the formula in the above, specified by the same preferable ranges.

When $X^2$ represents a hydrocarbon group, the hydrocarbon group is preferably $C_{1-3}$, preferably a substituted or unsubstituted $C_{1-3}$ alkylene group, more preferably an unsubstituted $C_{1-3}$ alkylene group, and still more preferably a methylene group or ethylene group. By adopting such hydrocarbon group, the curable composition for imprints will have lower viscosity and lower volatility.

$Y^2$ represents a substituent having no aromatic group and having a formula weight of 15 or larger, the upper limit of which being preferably 150 or smaller. Preferable examples of $Y^2$ include $C_{1-6}$ alkyl groups such as methyl group, ethyl group, isopropyl group, tert-butyl group and cyclohexyl group; halogen atoms such as fluoro group, chloro group, and bromo group; $C_{1-6}$ alkoxy groups such as methoxy group, ethoxy group, and cyclohexyloxy group; and cyano group.

n2 preferably denotes an integer of 1 or 2. When n2 is 1, the substituent Y is preferably at the para position. From the viewpoint of viscosity, when n2 is 2, $X^2$ preferably represents a single bond or $C_1$ hydrocarbon group.

In view of concomitantly achieving low viscosity and low volatility, the (meth)acrylate compound represented by the formula (I-2) preferably has a molecular weight of 175 to 250, and more preferably 185 to 245.

The (meth)acrylate compound represented by the formula (I-2) preferably has a viscosity at 25° C. of 50 mPa·s or smaller, and more preferably 20 mPa·s or smaller.

The compound represented by the formula (I-2) is also preferably used as a reactive diluent.

Amount of addition of the compound represented by the formula (I-2) in the curable composition for imprints is preferably 10% by mass or more, from the viewpoint of viscosity of the composition or pattern accuracy after being cured, more preferably 15% by mass or more, and particularly preferably 20% by mass or more. On the other hand, from the viewpoint of tackiness or mechanical strength after being cured, the amount of addition is preferably 95% by mass or less, more preferably 90% by mass or less, and particularly preferably 85% by mass or less.

Examples of the compound represented by the formula (I-2) will be shown below, of course without limiting the present invention. $R^1$ represents a hydrogen atom, alkyl group, or halogen atoms.

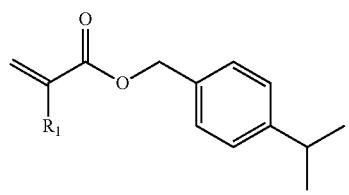

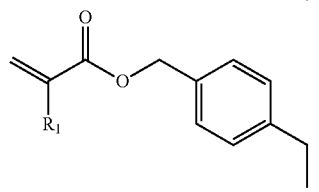

-continued

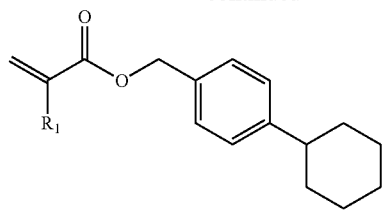

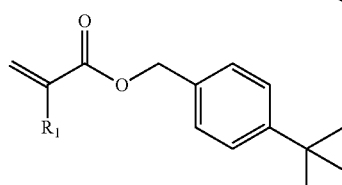

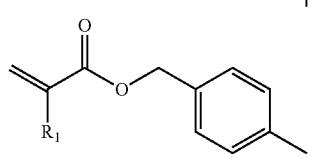

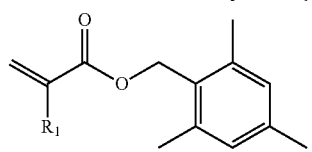

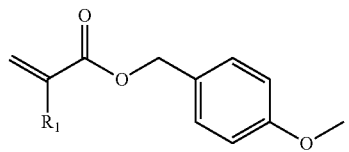

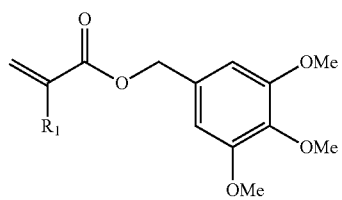

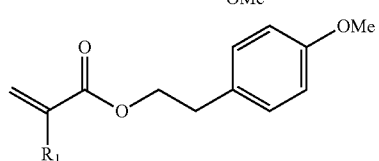

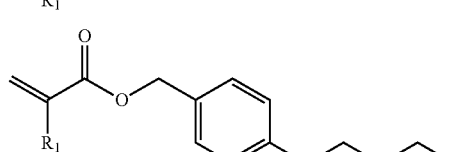

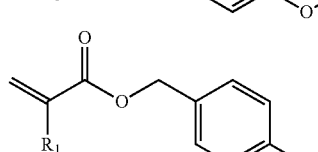

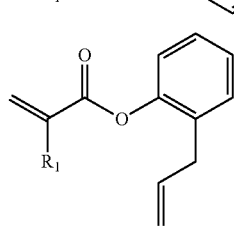

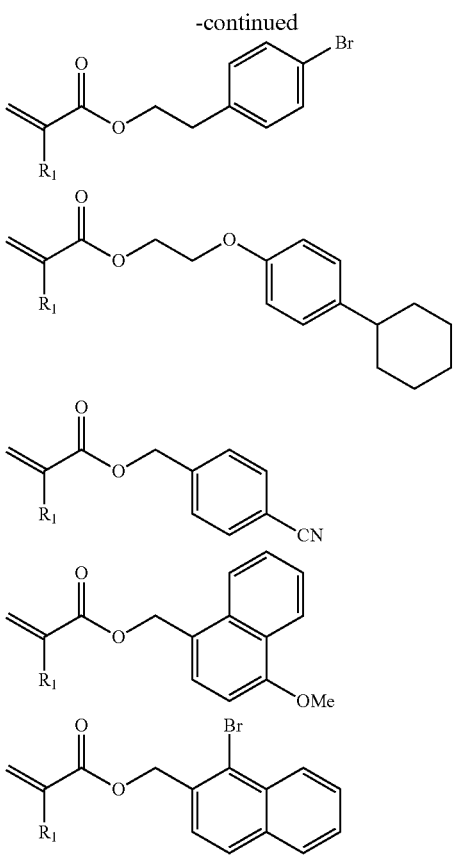

Compound Represented by Formula (I-3)

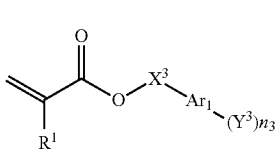
(I-3)

(In the formula (I-3), $R^1$ represents a hydrogen atom, alkyl group or halogen atom, $X^3$ represents a single bond or hydrocarbon group, wherein the hydrocarbon group may contain, in the chain thereof, a linking group having therein a hetero atom. $Y^3$ represents a substituent having an aromatic group, and n3 denotes an integer of 1 to 3.)

$R^1$ is synonymous to $R^1$ in the formula in the above, specified by the same preferable ranges.

$Y^3$ represents a substituent having an aromatic group, wherein the aromatic group is preferably bonded, via a single bond or a liking group, to the aromatic group Ar in the formula (I-3). Preferable examples of the linking group include alkylene group, hetero-atom-containing linking group (preferably —O—, —S—, —C(=O)O—), and combinations of them, wherein alkylene group, —O—, or any groups composed of combinations of them are more preferable. The substituent having an aromatic group preferably has a phenyl group together with a single bond or the above-described linking group, wherein particularly preferable examples include phenyl group, benzyl group, phenoxy group, benzyloxy group, and phenylthio group. $Y^3$ preferably has a formula weight of 230 to 350.

n3 is preferably 1 or 2, and more preferably 1.

Amount of addition of the compound represented by the formula (I-3) in the curable composition for imprints of the present invention is preferably 10% by mass or more, more preferably 20% by mass or more, and particularly preferably 30% by mass or more. On the other hand, from the viewpoint of tackiness and mechanical strength after being cured, the amount of addition is preferably 90% by mass or less, more preferably 80% by mass or less, and particularly preferably 70% by mass or less.

Examples of the compound represented by the formula (I-3) will be shown below, of course without limiting the present invention. $R^1$ represents a hydrogen atom, alkyl group, or halogen atoms.

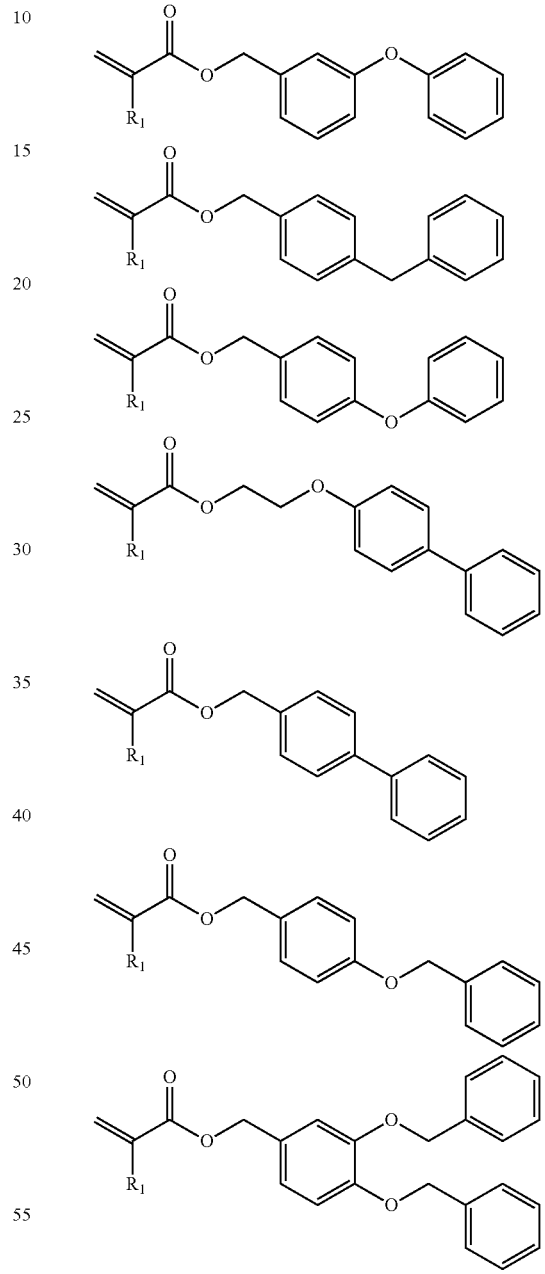

Multi-Functional (Meth)acrylate Compound Represented by Formula (II)

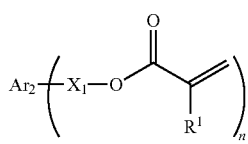
(II)

In the formula, $Ar_2$ represents an n-valent linking group having an aromatic group, and preferably a linking group having a phenylene group. $X_1$ and $R^1$ are synonymous to those described in the above. n is 1 to 3, and preferably 1.

The compound represented by the formula (II) is preferably the compounds represented by the formula (II-1) or (II-2) below.

Compound Represented by Formula (II-1)

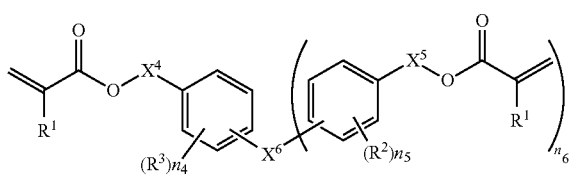

(In the formula (II-1), $X^6$ represents a (n6+1)-valent linking group, and each $R^1$ independently represents a hydrogen atom, alkyl group, or halogen atom. Each of $R^2$ and $R^3$ independently represents a substituent, and each of n4 and n5 independently represents an integer of 0 to 4. n6 is 1 or 2, each of $X^4$ and $X^5$ independently represents a hydrocarbon group, and the hydrocarbon group may contain, in the chain thereof, a hetero-atom-containing linking group.)

$X^6$ represents a single bond or (n6+1)-valent linking group, and preferably represents an alkylene group, —O—, —S—, —C(=O)O—, or linking group composed of an arbitrary combination of them. The alkylene group is preferably a $C_{1-8}$ alkylene group, more preferably a $C_{1-3}$ alkylene group, and is preferably unsubstituted.

n6 is preferably 1. When n6 is 2, each of a plurality of $(R^1)$s, $(X^5)$s and $(R^2)$s may be same or different from each other.

Each of $X^4$ and $X^5$ independently represents an alkylene group having no linking group, preferably a $C_{1-5}$ alkylene group, more preferably a $C_{1-3}$ alkylene group, and most preferably a methylene group.

$R^1$ is synonymous to $R^1$ in the formula in the above, specified by the same preferable ranges.

Each of $R^2$ and $R^3$ independently represents a substituent, and is preferably an alkyl group, halogen atom, alkoxy group, acyl group, acyloxy group, alkoxycarbonyl group, cyano group, or nitro group. The alkyl group is preferably a $C_{1-8}$ alkyl group. The halogen atom is exemplified by fluorine atom, chlorine atom, bromine atom, and iodine atom, wherein fluorine atom is preferable. The alkoxy group is preferably a $C_{1-8}$ alkoxy group. The acyl group is preferably a $C_{1-8}$ acyl group. The acyloxy group is preferably a $C_{1-8}$ acyloxy group. The alkoxycarbonyl group is preferably a $C_{1-8}$ alkoxycarbonyl group.

Each of n4 and n5 independently represents an integer of 0 to 4. When n4 or n5 is 2 or larger, each of a plurality of $(R^2)$s and $(R^3)$s may be same or different from each other.

The compound represented by the formula (II-1) is preferably a compound represented by the formula (II-1a) below:

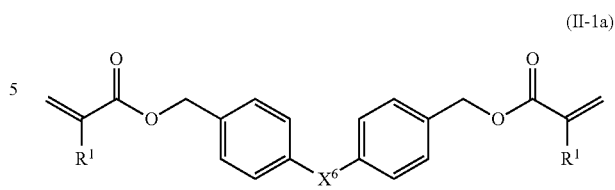

($X^6$ represents an alkylene group, —O—, —S— or a linking group composed of an arbitrary combination of them, and each $R^1$ independently represents a hydrogen atom, alkyl group or halogen atom.)

$R^1$ is synonymous to $R^1$ in the formula in the above, specified by the same preferable ranges.

When $X^6$ represents an alkylene group, it is preferably a $C_{1-8}$ alkylene group, more preferably a $C_{1-3}$ alkylene group, and is preferably unsubstituted.

$X^6$ is preferably —$CH_2$—, —$CH_2CH_2$—, —O— or —S—.

While content of the compound represented by the formula (II-1) in the curable composition for imprints of the present invention is not specifically limited, from the viewpoint of viscosity of the curable composition, it is preferably 1 to 100% by mass of the total mass of polymerizable compound, more preferably 5 to 70% by mass, and particularly preferably 10 to 50% by mass.

Examples of the compounds represented by the formula (II-1) will be shown below, of course without limiting the present invention. $R^1$ is synonymous to $R^1$ in the formula (II-1), specified by the same preferable ranges, and is particularly preferably a hydrogen atom.

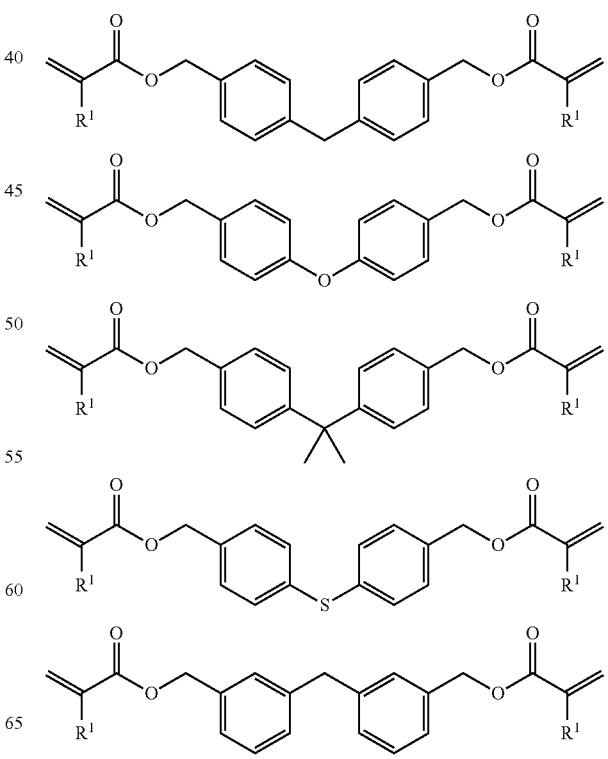

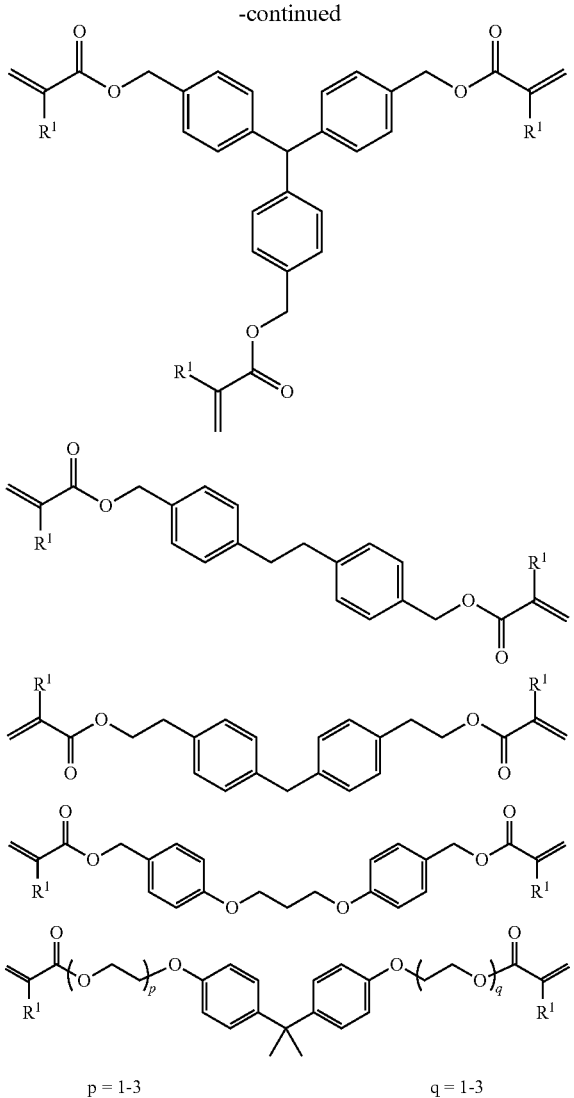

Polymerizable Compound Represented by Formula (II-2) Below

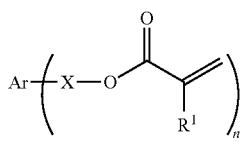
(II-2)

(In the formula, Ar represents an arylene group which may have a substituent, X represents a single bond or organic linking group, $R^1$ represents a hydrogen atom or methyl group, and n is 2 or 3.)

Examples of the arylene group in the formula includes hydrocarbon-based arylene group such as phenylene group and naphthylene group; and heteroarylene group having indole, carbazole or the like as a linking group, wherein the hydrocarbon-based arylene group is preferable, and phenylene group is more preferable from the viewpoints of less viscosity and etching resistance. The arylene group may have a substituent, wherein preferable examples of the substituent include alkyl group, alkoxy group, hydroxy group, cyano group, alkoxycarbonyl group, amide group, and sulfonamide group.

Examples of the organic linking group represented by X include alkylene group, arylene group, and aralkylene group which may contain a hetero atom in the chain thereof. Among them, alkylene group and oxyalkylene group are preferable, and alkylene group is more preferable. X is particularly preferably a single bond or alkylene group.

$R^1$ represents a hydrogen atom or methyl group, and is preferably a hydrogen atom.

n is 2 or 3, and preferably 2.

The polymerizable compound (II-2) is preferably a polymerizable compound represented by the formula (II-2a) or (II-2b) below, in view of lowering the viscosity of the composition.

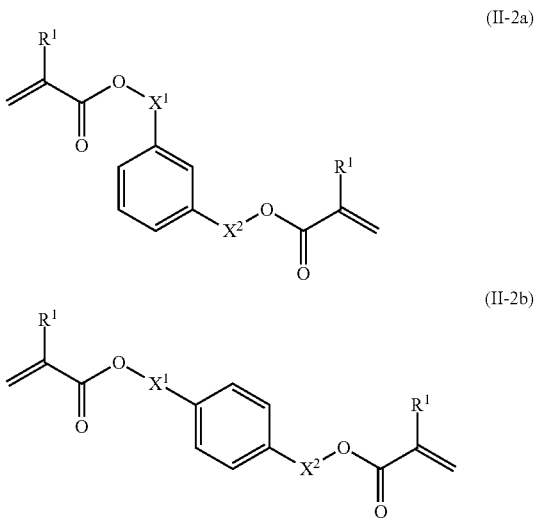

(In the formula, each of $X^1$ and $X^2$ independently represents single bond or an alkylene group which may have a $C_{1-3}$ substituent, and $R^1$ represents a hydrogen atom or methyl group.)

In the formula (II-2a), $X^1$ is preferably a single bond or methylene group, and more preferably a methylene group in view of lowering the viscosity of the composition.

Preferable ranges of $X^2$ are similar to those of $X^1$.

$R^1$ is synonymous to $R^1$ in the formula, specified by the same preferable ranges.

The polymerizable compound preferably exists in liquid form at 25° C., in view of suppressing deposition of some insoluble matter when the amount of addition thereof increases.

Specific examples of the polymerizable compound represented by the formula (II-2) will be shown below. $R^1$ is synonymous to $R^1$ in the formula, and represents a hydrogen atom or methyl group. Note that the present invention is not limited to these specific examples.

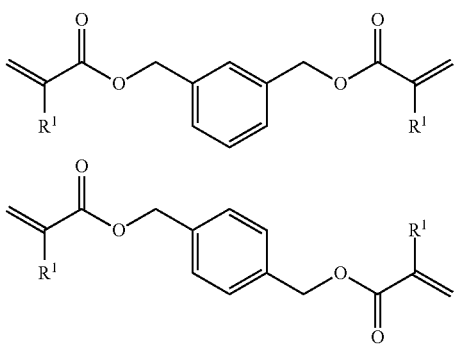

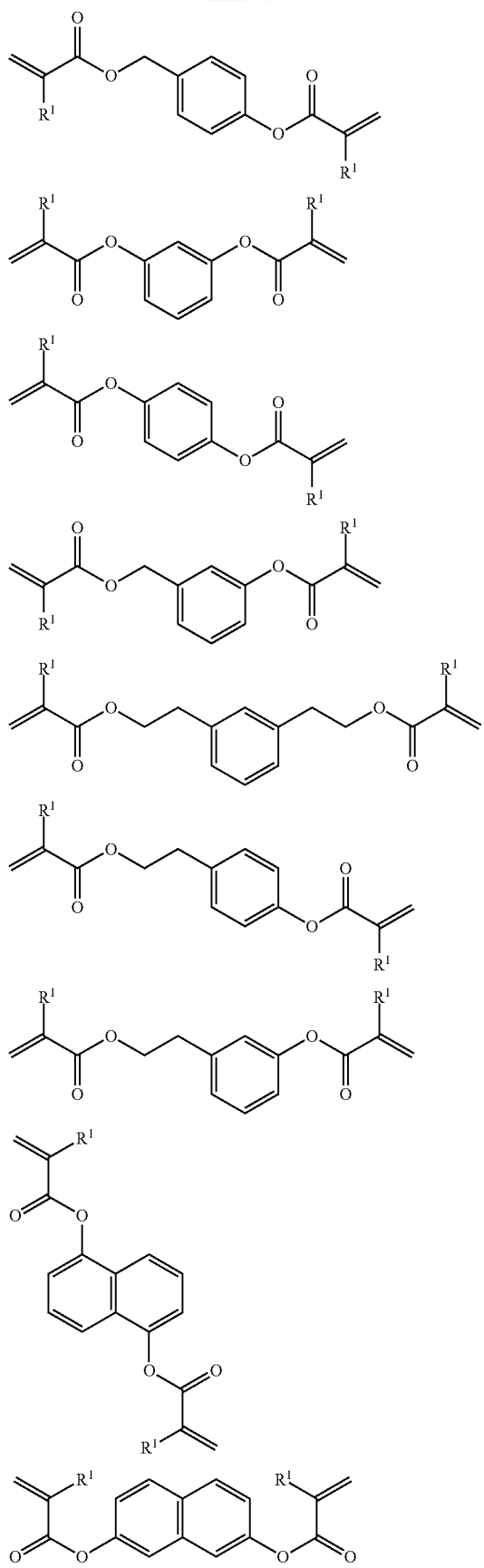
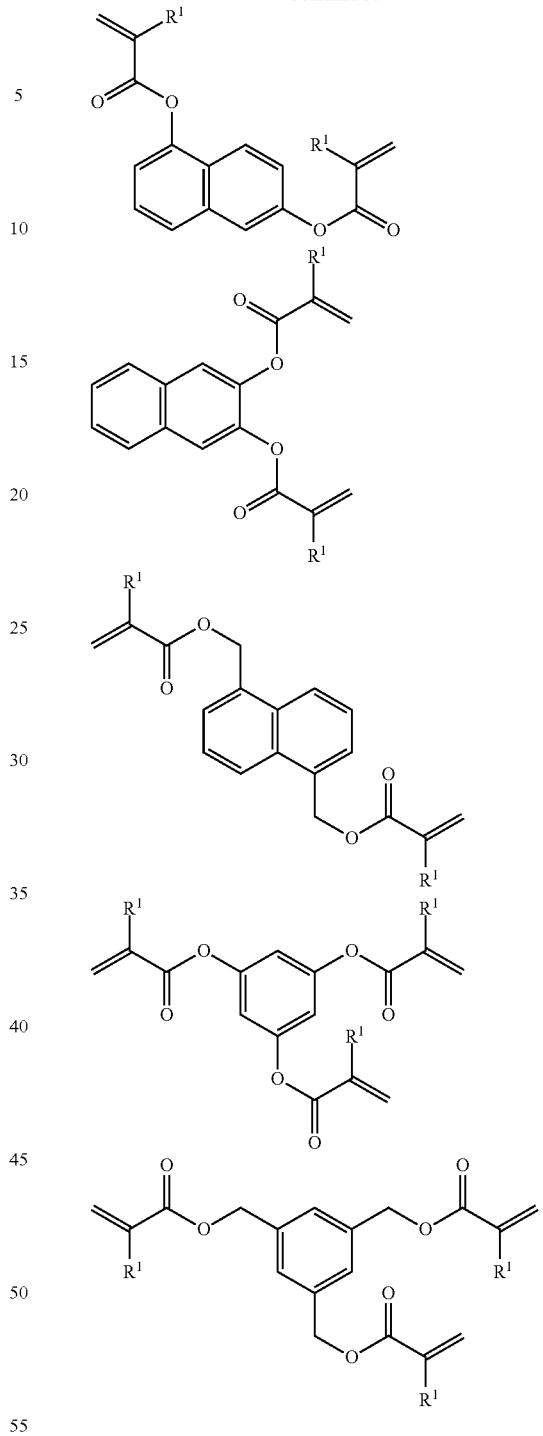

More preferable examples of the polymerizable compound having an aromatic group, used for the curable composition for imprints of the present invention, will be enumerated below, without limiting the present invention.

Preferable examples of the polymerizable compound having an aromatic group include benzyl (meth)acrylate which is unsubstituted or has a substituent on the aromatic ring thereof, phenethyl (meth)acrylate which is unsubstituted or has a substituent on the aromatic ring thereof, phenoxyethyl (meth)acrylate which is unsubstituted or has a substituent on the aromatic ring thereof, 1- or 2-naphthyl (meth)acrylate which is unsubstituted or has a substituent on the aromatic ring thereof, 1- or 2-naphthylmethyl (meth)acrylate which is unsubstituted or has a substituent on the aromatic ring thereof, 1- or 2-naphthylethyl (meth)acrylate which is unsubstituted or has a substituent on the aromatic ring thereof, 1- or 2-naphthoxyethyl (meth)acrylate, resolcinol di(meth)acrylate, m-xylylene di(meth)acrylate, naphthalene di(meth)acrylate, and ethoxylated bisphenol A diacrylate. More preferable examples include benzyl acrylate which is unsubstituted or has a substituent on the aromatic ring thereof, 1- or 2-naphthylmethyl acrylate, and m-xylylene diacrylate.

For the purpose of improving the separability from the mold, it is preferable to use a polymerizable compound having at least either one of fluorine atom and silicon atom.

The (A2) polymerizable compound having at least either one of fluorine atom and silicon atom of the present invention is a compound having at least one group having a fluorine atom, silicon atom, or, both of fluorine atom and silicon atom, and at least one polymerizable functional group. The polymerizable functional group is preferably a methacryloyl group, epoxy group, or vinyl ether group.

The (A2) polymerizable compound having at least either one of fluorine atom and silicon atom may be a low-molecular-weight compound or polymer.

When the (A2) polymerizable compound having at least either one of fluorine atom and silicon atom is a polymer, it may have a repeating unit having at least either one of fluorine atom and silicon atom, and a repeating unit, as a copolymerizing component, having a polymerizable group in the side chain thereof. Alternatively, the repeating unit having at least either one of fluorine atom and silicon atom may have a polymerizable group in the side chain thereof, and in particular, at the terminal thereof. In this case, while the skeleton of the repeating unit having at least either one of fluorine atom and silicon atom is not specifically limited without departing from the gist of the present invention, the repeating unit preferably has a skeleton typically derived from an ethylenic unsaturated group-containing group, and more preferably has a (meth)acrylate skeleton. The repeating unit having a silicon atom may have the silicon atom in the skeleton thereof, such as in a siloxane structure (dimethylsiloxane structure, for example). The weight average molecular weight is preferably 2,000 to 100,000, more preferably 3000 to 70,000, and particularly preferably 5,000 to 40,000.

While content of (A2) in the curable composition for imprints of the present invention is not specifically limited, it is preferably 0.1 to 20% by mass of the total mass of polymerizable compound, from the viewpoints of reducing viscosity of composition, more preferably 0.2 to 15% by mass, still more preferably 0.5 to 10% by mass, and particularly 0.5 to 5% by mass.

Polymerizable Compound Having Fluorine Atom

The fluorine atom-containing group owned by the fluorine atom-containing polymerizable compound is preferably selected from fluoroalkyl group and fluoroalkyl ether group.

The fluoroalkyl group is preferably a fluoroalkyl group having carbon atoms of 2 to 20, and a fluoroalkyl group having carbon atoms of 4 to 8. Preferable examples of fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

The polymerizable compound having fluorine atom (A2) is preferably a polymerizable compound having trifluoromethyl group. By virtue of the trifluoromethyl group structure, the effects of the present invention may be expressed only with a small amount of addition (10% by mass or less, for example), so that compatibility with other components may be improved, line edge roughness after dry etching may be improved, and formability of repetitive pattern may be improved.

The fluoroalkyl ether group preferably has a trifluoromethyl group, similarly to the fluoroalkyl group, which may be exemplified by perfluoroethylenoxy group and perfluoropropyleneoxy group. Preferable examples are those having a fluoroalkyl ether unit having a trifluoromethyl group such as —(CF(CF$_3$)CF$_2$O)—, and/or those having a trifluoromethyl group at the terminal of the fluoroalkyl ether group.

The total number of fluorine atoms per one molecule, owned by the polymerizable compound, having at least either one of fluorine atom and silicon atom (A2), is preferably 6 to 60, more preferably 9 to 40, even more preferably 12 to 40, still more preferably 12 to 20.

The polymerizable compound having at least either one of fluorine atom has a fluorine content, defined below, of 20 to 60%, more preferably 30 to 60%, and still more preferably 35 to 60%. By adjusting the fluorine content in the appropriate range, the curable composition may be improved in compatibility with other components, less causative of fouling on mold, improved in the line edge roughness after dry etching, and improved in the formability of repetitive pattern transfer. In this patent specification, the fluorine content is given by the equation below:

Fluorine content=[{(Number of fluorine atoms in polymerizable compound)×(atomic weight of fluorine atom)}/(molecular weight of polymerizable compound)]×100

As a preferable example of the (A2)fluorine atom-containing of polymerizable compound, having at least either one of fluorine atom and silicon atom, a compound having a partial structure represented by formula (I) below may be exemplified. By adopting a compound having such partial structure, the curable composition having an excellent formability of pattern, even after repetitive pattern transfer, may be obtained, and stability over time of the composition may be improved.

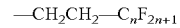  Formula (I)

In formula (I), n represents an integer of 1 to 8, and preferably 4 to 6.

One preferable example of the (A2) polymerizable compound having fluorine atom is exemplified by a compound having a partial structure represented by the following formula (II). Of course, the polymerizable compound having fluorine atom may have both of the partial structure represented by the following formula (I) and the partial structure represented by the following formula (II).

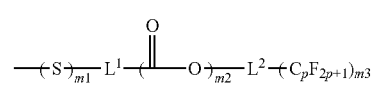  Formula (II)

(In the formula (II), L$^1$ represents a single bond, or an alkylene group having carbon atoms of 1 to 8, L$^2$ represents an alkylene group having carbon atoms of 1 to 8, m1 and m2 each represent 0 or 1, wherein at least one of m1 and m2 is 1, m2 is an integer of 1 to 3, p is an integer of 1 to 8, and when m3 is 2 or more, each of —C$_p$F$_{2p+1}$ may be the same or different to each other.)

The above $L^1$ and $L^2$ each preferably are an alkylene group having carbon atoms of 1 to 4. The alkylene group may have a substituent without diverting the scope of the gist of the present invention. The above m3 is preferably 1 or 2. The above p is preferably an integer of 4 to 6.

Examples of the fluorine atom-containing polymerizable compound in the curable composition for imprints of the present invention will be shown below, of course without limiting the present invention.

As the fluorine atom-containing polymerizable compound, exemplified are fluorine atom-containing monofunctional polymerizable compound such as 2,2,2-trifluoroethyl (meth)acrylate, pentafluoroethyl (meth)acrylate, 2-(perfluorobutyl)ethyl (meth)acrylate, 3-perfluorobutyl-2-hydroxypropyl (meth)acrylate, 2-(perfluorohexyl)ethyl (meth)acrylate, 2,2,3,3,4,4,5,5-octafluoropentyl (meth)acrylate, 2-perfluorooctylethyl (meth)acrylate, 2,2,3,3-tetrafluoropropyl (meth)acrylate, and 2,2,3,3,4,4-hexafluorobutyl (meth)acrylate. Also multi-functional polymerizable compound having two or more polymerizable functional groups, such as those having di(meth)acrylate structure having fluoroalkylene group, exemplified by 2,2,3,3,4,4-hexafluoropentane-1,5-diol di(meth)acrylate and 2,2,3,3,4,4,5,5-octafluorohexane-1,6-diol di(meth)acrylate, may be preferable examples of the fluorine atom-containing polymerizable compound.

Also compounds having two or more fluorine-containing groups, such as fluoroalkyl group and fluoroalkyl ether group, in one molecule may preferably be used.

The compound having two of fluoroalkyl groups and/or fluoroalkyl ether groups in one molecule is preferably represented by the following formula (III);

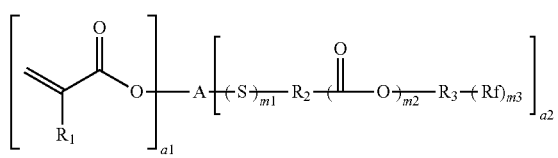

(III)

wherein $R^1$ represents a hydrogen atom, an alkyl group, a halogen atom, or a cyano group, preferably a hydrogen atom, or an alkyl group, more preferably a hydrogen atom, or methyl group; A is a (a1+a2)-valent linking group, preferably a linking group having an alkylene group and/or an arylene group, which may have a linking group comprising a hetero atom. Examples of the linking group having a hetero atom include —O—, —C(=O)O—, —S—, —C(=O)—, —NH—. Those groups may have a substituent, but preferably a group not having a substituent. A preferably has 2 to 50 carbon atoms, more preferably represents 4 to 15.

a1 represents an integer of 1 to 6, preferably 1 to 3, and more preferably 1 or 2.

a2 represents an integer of 2 to 6, preferably 2 or 3, and more preferably 2.

$R^2$ and $R^3$ each represent a single bond or an alkylene group having a carbon atoms of 1 to 8. m1 and m2 each represent 0 or 1. m3 represents an integer of 1 to 3.

When a1 is 2, the individual (A)s may be same with, or different from each other.

When a2 is 2 or larger, each of $R^2$, $R^3$, m1, m2, and m3 may be same with, or different from each other.

Rf represents a fluoroalkyl group or a fluoroalkyl ether group, preferably a fluoroalkyl group having carbon atoms of 1 to 8, and a fluoroalkyl ether group having carbon atoms of 3 to 20.

When the polymerizable compound having fluorine atom is a polymer, a polymer comprising a repeating unit derived from the above polymerizable compound having fluorine atom is preferable.

Specific examples of the polymerizable compound having fluorine atom used for the curable composition for imprints of the present invention will be given below, without restricting the present invention. $R^1$ in the formulae below represents any of hydrogen atom, alkyl group, halogen atom and cyano group.

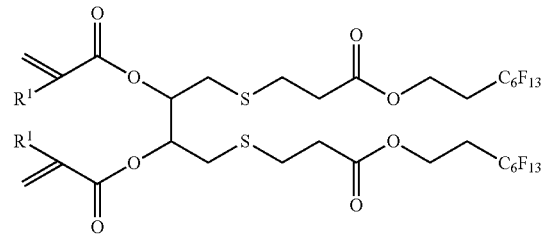

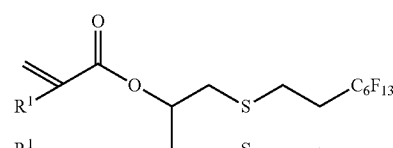

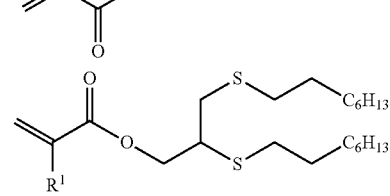

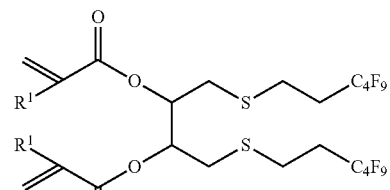

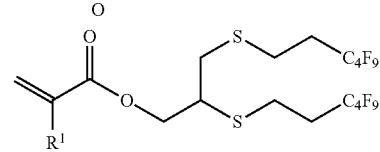

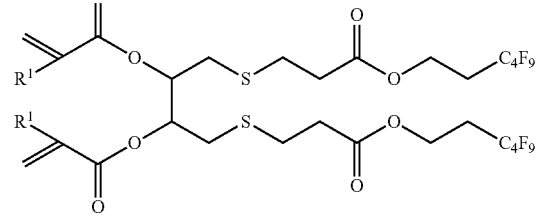

35
-continued
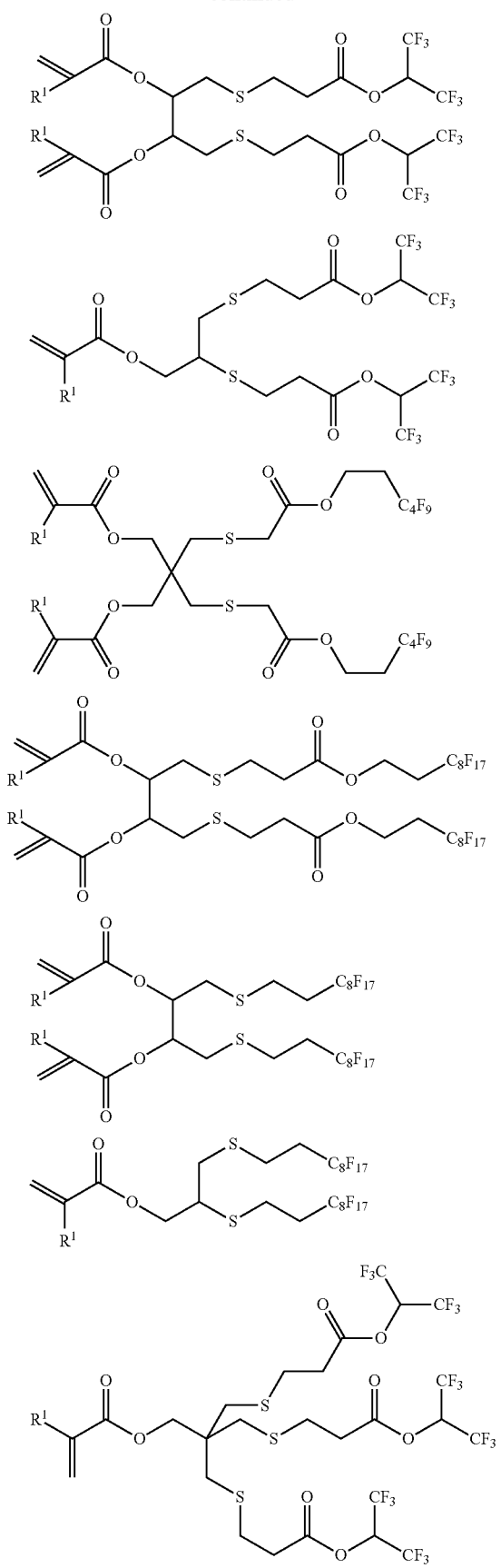
36
-continued
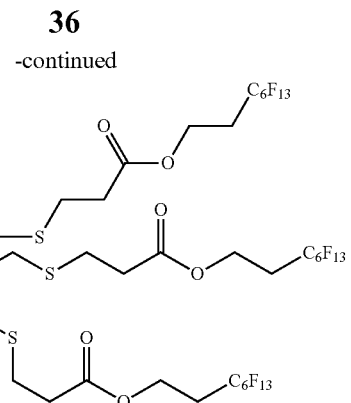
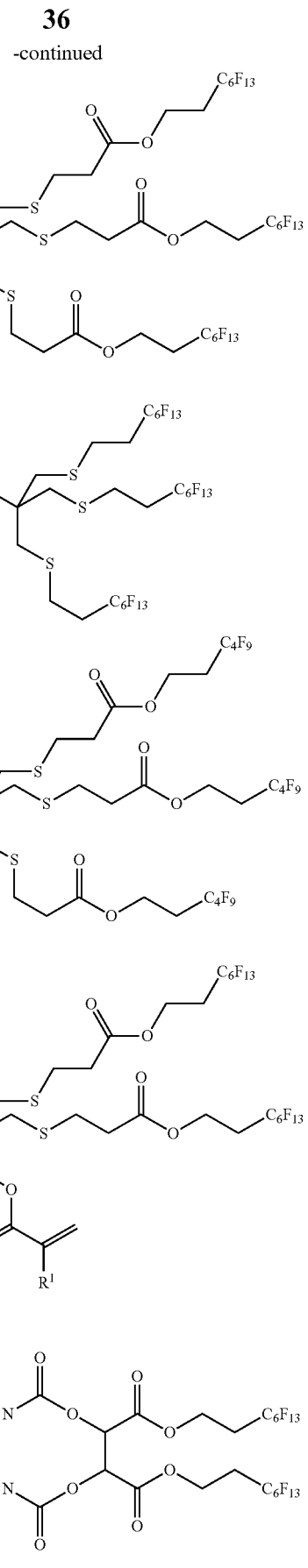

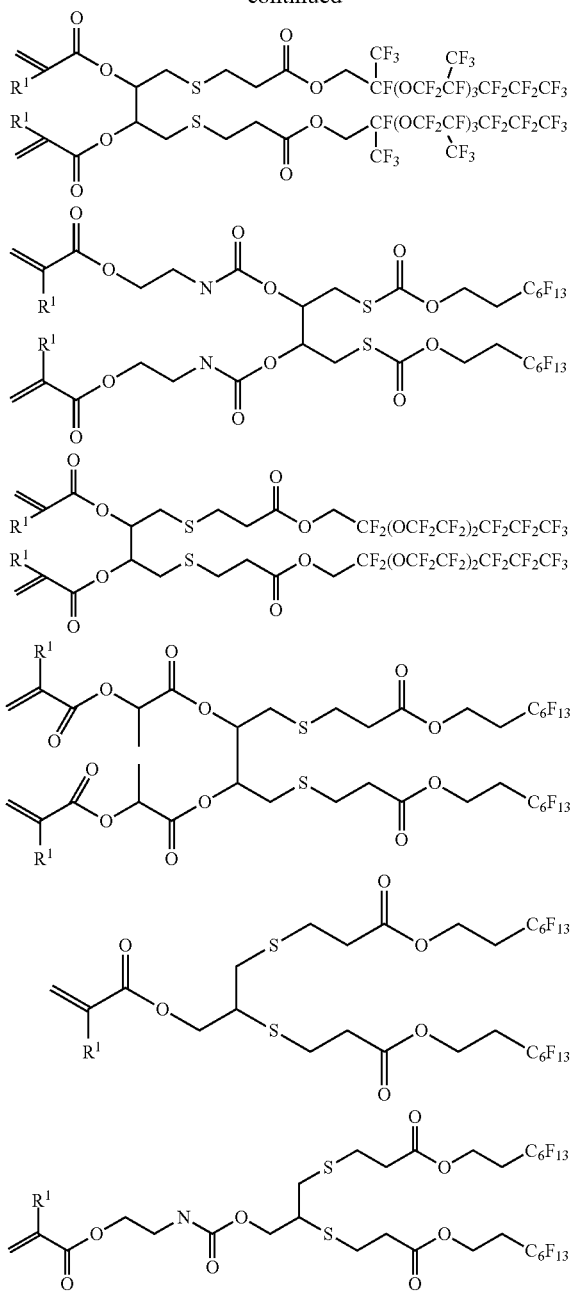

(2) Polymerizable Monomer Having Silicon Atom

A silicon-containing functional group that the above polymerizable monomer having silicon atom has is exemplified by a trialkyl silyl group, a trialkylsilyl group, a chain-like siloxane structure, a circular siloxane structure, and a cage-type siloxane structure. From the viewpoints of compatibility and mold releasability, it is preferable a trimethylsilyl group, or a functional group having a dimethylsiloxane structure.

The silicon atom-containing polymerizable monomer may be exemplified by 3-tris(trimethylsilyloxy)silylpropyl (meth)acrylate, trimethylsilylethyl (meth)acrylate, (meth)acryloylmethylbis(trimethylsiloxy)methyl silane, (meth)acryloxymethyl tris(trimethylsiloxy)silane, 3-(meth)acryloxypropyl bis(trimethylsiloxy)methyl silane, a polysiloxane having a (meth)acryloyl group at a terminal or at a side chain which is exemplified by X-22-164 series, X-22-174DX, X-22-2426 and X-22-2475 manufactured by Shin-Etsu Chemical Co., Ltd.

As the polymerizable compound, preferably contained is a polymerizable compound having an alicyclic hydrocarbon group and/or aromatic group, and, more preferably contained are both of the polymerizable compound having an alicyclic hydrocarbon group and/or aromatic group, and a polymerizable compound having containing silicon atom and/or fluorine atom. It is further preferable that the total mass of the polymerizable compounds having an alicyclic hydrocarbon group and/or aromatic group, out of all polymerizable components contained in the curable composition for imprints of the present invention, is 30 to 100% by mass relative to the total polymerizable compounds, more preferably 50 to 100% by mass, and still more preferably 70 to 100% by mass.

In a more preferable embodiment, as the polymerizable compound, the (meth)acrylate polymerizable compound containing aromatic group preferably accounts for 50 to 100% by mass of the total polymerizable components, more preferably 70 to 100% by mass, and particularly 90 to 100% by mass.

In a particularly preferable embodiment, a polymerizable compound (1) described below accounts for 0 to 80% by mass of the total polymerizable components (more preferably 20 to 70% by mass), a polymerizable compound (2) described below accounts for 20 to 100% by mass of the total polymerizable components (more preferably 50 to 100% by mass), and a polymerizable compound (3) described below accounts for 0 to 10% by mass of the total polymerizable components (more preferably 0.1 to 6% by mass).

(1) Polymerizable compound having an aromatic group (preferably phenyl group or naphthyl group, and more preferably naphthyl group) and a (meth)acrylate group;

(2) polymerizable compound having an aromatic group (preferably phenyl group or naphthyl group, and more preferably phenyl group) and two (meth)acrylate groups; and (3) polymerizable compound having at least either one of fluorine atom and silicon atom, and a (meth)acrylate group.

In the curable composition for imprints, content of the polymerizable compound having a viscosity at 25° C. of smaller than 5 mPa·s is 50% by mass or less, relative to the total polymerizable compound, more preferably 30% by mass or less, and still more preferably 10% by mass or less. By adjusting the content to the above-described ranges, stability of discharge of ink in the ink jet process may be improved, and transfer failure in imprinting may be reduced.

Polymerization Initiator (D)

In the curable composition for imprints used in the present invention, a photo-polymerization initiator is contained. The photo-polymerization initiator used in the present invention may be any compound which generates an active species capable of polymerizing the above-described polymerizable compound under photoirradiation. The photo-polymerization initiator is preferably a radical polymerization initiator or cationic polymerization, and the radical polymerization initiator is more preferable. In the present invention, a plurality of species of photo-polymerization initiator may be used.

The content of the photo-polymerization initiator to be in all of the component except for solvents in the composition of the invention may be, for example, from 0.01 to 15% by mass of all the polymerizable monomers constituting the composition, preferably from 0.1 to 12% by mass, more preferably from 0.2 to 7% by mass. In case where two or more different types of photo-polymerization initiators are used, the total amount thereof falls within the above range.

When the content of the photo-polymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better.

Commercially available initiators may be adoptable to the radical photo-polymerization initiator in the present invention. Those described in paragraph [0091] in Japanese-A-2008-105414 may preferably be used. Among them, acetophenone-base compound, acylphosphine oxide-base compound, and oxime ester-base compound are preferable from the viewpoint of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy) phenyl]-2-hydroxy-2-methyl-1-propanone, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propanone), all of which are available from.

The dialkoxyacetophenone-base compound may preferably be exemplified by Irgacure (registered trademark) 651 (2,2-dimethoxy-1,2-diphenylethan-1-one) available from BASF GmbH.

The aminoacetophenone-base compound may preferably be exemplified by Irgacure (registered trademark) 369 (2-benzyl-2-dimethylamino-1-(4-morpholinophenyl)-1-butanone), Irgacure (registered trademark) 379 (EG) (2-dimethylamino-2-(4-methylbenzyl)-1-[4-(morpholine-4-yl)-phenyl]butan-1-one), and Irgacure (registered trademark) 907 (2-methyl-1-[4-(methylthio)phenyl]-2-morpholinopropane-1-one), all of which are available from BASF GmbH.

The acylphosphine oxide-base compound may preferably be exemplified by Irgacure (registered trademark) 819 (bis (2,4,6-trimethylbenzoyl)-phenylphosphine oxide), Irgacure (registered trademark) 1800 (bis (2,6-dimethoxybenzoyl)-2,4,4-trimethyl-pentylphosphine oxide), Lucirin TPO ((2,4,6-trimethylbenzoyl)diphenylphosphine oxide), and Lucirin TPO-L ((2,4,6-trimethylbenzoyl)phenylethoxyphosphine oxide), all of which are available from BASF GmbH.

The oxime ester-base compound may preferably be exemplified by Irgacure (registered trademark) OXE01 (1,2-octanedione,1-[4-(phenylthio)phenyl]-, 2-(O-benzoyloxime)), and Irgacure (registered trademark) OXE02 (ethanone,1-[9-ethyl-6-(2-methylbenzoyl)-9H-carbazole-3-yl]-,1-(O-acetyloxime)), all of which are available from BASF GmbH.

The cation photo-polymerization initiator adoptable to the present invention is preferably sulfonium salt compound, iodonium salt compound, and oxime sulfonate compound, and may preferably be exemplified by 4-methylphenyl[4-(1-methylethyl) phenyliodonium tetrakis(pentafluorophenyl)borate (PI2074, from Rhodia), 4-methylphenyl[4-(2-methylpropyl)phenyliodonium hexafluorophophate (Irgacure 250), Irgacure PAG103, 108, 121 and 203 (from BASF GmbH).

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

—Surfactant—

The curable composition for imprints used in the present invention preferably contains a surfactant. Content of the surfactant used in the present invention is preferably 0.001 to 5% by mass, for example, of the whole components, preferably 0.002 to 4% by mass, and more preferably 0.005 to 3% by mass. For the case where two or more species of surfactant are used, the total content of which falls in the above-described ranges. When the content of surfactant is adjusted to the range from 0.001 to 5% by mass of the composition, a good effect of ensuring uniformity in coating may be obtained, while preventing degradation of mold transferability due to excess of surfactant.

As the surfactant, preferred are nonionic surfactants. Preferably, the composition comprises at least one of a fluorine-containing surfactant, a silicone-type surfactant and a fluorine-containing silicone-type surfactant. More preferably, the composition comprises both a fluorine-containing surfactant and a silicone-type surfactant, or a fluorine-containing silicone-type surfactant. The most preferably, the composition comprises a fluorine-containing silicone-type surfactant. As the fluorine-containing surfactant and the silicone-type surfactant, preferred are nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Preferable examples of the surfactant adoptable to the present invention include those of nonionic fluorine-containing surfactant, nonionic Si based surfactant, and fluorine-containing Si based surfactant, which were exemplified in the foregoing description regarding the underlay film composition.

—Antioxidant—

Preferably, the curable composition for imprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF GmbH); Antigene P, 3C, FR, Sumilizer S, Sumilizer GA80 (by Sumitomo Chemical); Adekastab AO70, AO80, AO503 (by Adeka), etc. These may be used either singly or as combined.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

Preferable examples of the polymerization inhibitor adoptable to the present invention include those exemplified in the foregoing description regarding the underlay film composition.

—Solvent—

A solvent may be used for the curable composition for imprints of the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the curable composition for imprints of the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition. When the curable composition for imprints of the present invention is applied onto the substrate by inkjet method, it is preferred that the composition does not substantially contain a solvent (for example 3% by mass or less, preferably 1% by mass or less). On the other hand, when a pattern having a film thickness of 500 nm or less is formed by spin-coating method or the like, the content may be 20 to 99% by mass, preferably 40 to 99% by mass, specifically preferably 70 to 98% by mass.

—Polymer Ingredient—

The composition of the invention may contain a polyfunctional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints of the present invention may further contain a polymer component, in view of improving the dry etching resistance, imprint suitability and curability. The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, and most preferably 2% by mass or less. Pattern formability may be improved by adjusting the content of polymer component having a molecular weight of 2,000 or larger, with respect to the portion of the curable composition for imprints of the present invention excluding the solvent. From the viewpoint of pattern formability, as least as possible amount of resin component is preferable, and therefore the curable composition preferably contains no polymer component other than those composing the surfactant or trace amounts of additives.

In addition to the above-mentioned ingredients, the curable composition for imprints of the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

In the present invention, the underlay film composition and the curable composition for imprints is preferably combined so that a value (Y) of (Equation 1) of the polymerizable compound contained in the curable composition for imprints, and a value (Z) of (Equation 1) of the compound (A) contained in the underlay film for imprints, satisfy (Y)≤(Z), wherein the value of (Z)−(Y) is more preferably 0.2 or larger, still more preferably 0.5 or larger, and most preferably 1 or larger.

When a plurality of polymerizable compounds are contained in the curable composition for imprints, (Y) is a sum of products of the respective values of (Equation 1) and mass fraction of the individual polymerizable compounds.

The value (Y) of (Equation 1) of the polymerizable compound contained in the curable composition for imprints, and a sum (Za) of products of the respective values (Y) of (Equation 1) and mass fraction of the whole components, excluding the solvent, contained in the underlay film composition, preferably satisfy (Y)≤(Za). The value of (Za)−(Y) is preferably 0.2 or larger, more preferably 0.5 or larger, and most preferably 1 or larger. The upper limit value is generally 20 or smaller, although not specifically limited.

According to a second embodiment of the present invention, there is provided a pattern formation method which include:

applying, onto the substrate, an underlay film composition for imprints, to thereby form an underlay film;

curing the curable composition for imprints, while holding the curable composition for imprints between the underlay film and a mold having the micropattern formed thereon; and releasing the mold, wherein a value (Y) of (Equation 1) of the polymerizable compound contained in the curable composition for imprints, and a sum (Za) of products of the value (Y) of (Equation 1) and mass ratio of the whole components, excluding the solvent, contained in the underlay film composition, satisfy (Y)≤(Za).

$$\text{(Total number of atoms)/(Number of carbon atoms} - \text{Number oxygen atoms)} \quad \text{(Equation 1)}$$

In a more preferable embodiment, the value of (Za)−(Y) is 0.2 or larger, more preferably 0.5 or larger, and most preferably 1 or larger. In addition, the underlay film composition is preferably the underlay film composition of the first embodiment described in the above, and the curable composition for imprints is preferably the curable composition for imprints of the first embodiment described in the above.

By adjusting the values of (Y), (Z) and (Za) in appropriate ranges, the line edge roughness of the processed substrate may be improved.

In the present invention, it is particularly preferable that the compound (A) contained in the underlay film composition has substantially no aromatic group, and, the polymerizable compound contained in the curable composition for imprints has an aromatic group or alicyclic hydrocarbon group. By selecting the combination, the pattern may be prevented from being damaged when the underlay film is removed by ashing or etching, and thereby the line edge roughness of the finally obtainable pattern of the substrate may be improved.

The curable composition for imprints used in the present invention may be prepared by mixing the individual components described in the above. The curable composition is mixed and dissolved generally in the temperature range from 0° C. to 100° C. After the mixing, the mixture is preferably filtered through a filter having a pore size of 0.003 μm to 5.0 μm for example. The filtration may be proceeded according to a multi-step scheme or may be repeated multiple times. The filtrate may be re-filtered. Examples of material for composing the filter used for the filtration include polyethylene resin, polypropylene resin, fluorine-containing resin, and nylon resin, although not specifically limited.

The curable composition for imprints used in the present invention is preferably configured so that a mixed solution of the whole components excluding the solvent shows a viscosity of 100 mPa·s or smaller, more preferably 1 to 70 mPa·s, still more preferably 2 to 50 mPa·s, and most preferably 3 to 30 mPa·s.

The curable composition for imprints used in the present invention is bottled, after being manufactured, into a container such as gallon bottle or coated bottle, and transported and stored. In this case, the inner space of the container may be replaced with inert nitrogen, argon or the like, for the purpose of preventing degradation. While the curable composition for imprints may be transported and stored at normal temperature, the temperature may also be controlled in the range from −20° C. to 0° C. in order to prevent denaturation. Of course, it is preferably shielded from light to a degree enough to prevent reaction.

A permanent film (resist used as structural component) to be remained for use in liquid crystal display device (LCD), and a resist used for processing of the substrate composed of electronic materials are strongly required to avoid contamination by ionic impurities such as metals and organic substances, so that operations of the product will not be interfered. For this purpose, concentration of the ionic impurities such as metals or organic substances in the curable composition for imprints of the present invention is preferably suppressed to 1 ppm or below, more preferably 100 ppb or below, and still more preferably 10 ppb or below.

[Pattern Formation Method]

A pattern formation method (pattern transfer method) using the curable composition for imprints will be detailed below.

In the pattern formation method of the present invention, first, the curable composition for imprints is applied onto the underlay film to form a pattern forming layer.

Methods of applying the curable composition for imprints of the present invention onto the underlay film is arbitrarily selectable from those publicly known.

The methods of application include dip coating, air knife coating, curtain coating, wire bar coating, gravure coating, extrusion coating, spin coating, slit scanning, and ink jet process, by which a coated film or liquid droplets are formed on the underlay film. Thickness of the pattern forming layer composed of the curable composition for imprints used in the present invention is approximately 0.03 μm to 30 μm, which may vary depending on applications. The curable composition for imprints may be coated according to a multiple-coating scheme. In a method of forming liquid droplets onto the underlay film typically by ink jet process, liquid droplets preferably has a volume of approximately 1 pl to 20 pl, and are arranged on the underlay film while being spaced from each other.

In the pattern formation method of the present invention, next, a mold is pressed to the surface of the pattern forming layer, so as to transfer a pattern to the pattern forming layer. In this way, the micropattern preliminarily formed on the pressing surface of the mold may be transferred to the pattern forming layer.

Alternatively, the curable composition for imprints may be coated on the patterned mold, and the underlay film may be pressed thereto.

Next, the mold material adoptable to the present invention will be explained. For photonanoimprint lithography using the curable composition for imprints, a light-transmissive material is selected for composing at least either one of the mold and substrate. In the photoimprinting lithography adopted to the present invention, the curable composition for imprints is coated over the substrate to form the pattern forming layer, the light-transmissive mold is pressed to the surface thereof, and light is irradiated from the back side of the mold to thereby cure the pattern forming layer. Alternatively, the curable composition for imprints may be coated over the light-transmissive substrate, the mold may be pressed thereto, and light may be irradiated from the back side of the substrate to thereby cure the curable composition for imprints.

The photoirradiation may be conducted while keeping the mold in contact or after releasing the mold. The photoirradiation with the mold kept in contact is preferred in the present invention.

The mold adoptable to the present invention has a pattern to be transferred. The pattern on the mold may be formed typically by photolithography, electron beam lithography or the like, depending on a desired level of process accuracy, without limiting methods of forming the mold pattern. Alternatively, a pattern formed by the pattern formation method of the present invention may be used as a mold.

Materials for composing the light-transmissive mold used in the present invention are arbitrarily selectable from those having predetermined levels of strength and durability, without special limitation. Specific examples thereof include glass, quartz, light-transmissive resins such as PMMA and polycarbonate resin, transparent metal evaporated film, flexible film such as polydimethyl siloxane, photo-cured film and metal film.

Non-light-transmissive mold materials, adoptable to the present invention when the light-transmissive substrate is used, are arbitrarily selectable from those having predetermined levels of strength, without special limitation. Specific examples thereof include ceramic material, evaporated film, magnetic film, reflective film, metal substrates composed of Ni, Cu, Cr or Fe, and substrates composed of SiC, silicon, silicon nitride, polysilicon, silicon oxide or amorphous silicon, without special limitation. Also geometry of the substrate is not specifically limited, and may be given in the form of sheet or roll. The mold in the roll form is adopted when continuity in production is required for pattern transfer.

The mold used in the pattern formation method of the present invention may be treated with a mold releasing agent, aiming at improving separability between the curable composition for imprints and the mold surface. Examples of this sort of mold include those treated with a silicone-based or fluorine-containing silane coupling agent, also commercially available under the trade name of Optool DSX from Daikin Industries Ltd., and Novec EGC-1720 from Sumitomo 3M Ltd.

When the curable composition for imprints is used in photoimprinting lithography, the pattern formation method of the present invention is preferably conducted under a mold pressure of 10 atm or below. By adjusting the mold pressure to 10 atm or below, there are tendencies of suppressing deformation of the mold and substrate, and improving the pattern accuracy. The low pressure is preferable also in terms of possibility of downsizing the apparatus. The mold pressure is selectable within the range capable of ensuring uniformity in the mold transfer, when observed in a region of the curable composition for imprints thinned under projected portions of the mold.

In the pattern formation method of the present invention, energy of photoirradiation in the process of irradiating light to the pattern forming layer is good enough if it is sufficiently larger than a level energy required for curing. The level of energy of irradiation required for curing is appropriately determined, by analyzing consumption of the unsaturated bonds of the curable composition for imprints and tackiness of the cured film.

In the photoimprinting lithography adoptable to the present invention, while the photoirradiation is generally conducted while keeping the substrate to normal temperature, the photoirradiation may also be conducted under heating in order to enhance the reactivity. Also the photoirradiation in vacuo is preferable, since vacuum established prior to the photoirradiation is effective in preventing entrainment of bubbles, suppressing lowering in the reactivity due to invasion of oxygen, and enhancing adhesiveness between the mold and the curable composition for imprints. In the pattern formation method of the present invention, a preferable degree of vacuum in the photoirradiation is in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (layer comprising the curable composition for imprints) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

The patterned stacked article of the present invention, composed of the substrate, the underlay film for imprints, and the curable composition for imprints, may be used as a permanent film (resist used as structural components) used for liquid crystal display (LCD) and so forth.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

In the Examples, the compounds listed in Tables 1 and 2 were mixed according to the ratios listed in Table 3, and each mixture was dissolved in propylene glycol monomethylether acetate, to thereby prepare a 0.1% by mass solution. The solution was filtered through a tetrafluoroethylene filter with a pore size of 0.1 μm to obtain the individual underlay film compositions. Each of the underlay film compositions was then coated onto a silicon wafer by spin coating, and dried on a hot plate at 100° C. for 1 minutes so as to vaporize the solvent off. The dried matter was cured under heating at 220° C. for 5 minutes, to thereby form the underlay film. The underlay film after dried was found to be 3 nm thick.

Note that, in Table 3 below, "Equation (1)" represents a sum of products of the respective values of (Equation 1) and mass fraction of the individual polymerizable compounds. The ratio of mixing of the compounds is given in parts by mass.

TABLE 1

| | Compound (A) of invention | Availability | Equation (1) | Molecular weight |
|---|---|---|---|---|
| Aa1 | Polyethylene glycol 600 | from Wako Pure Chemical Industries Ltd. | 7.8 | 600 |
| Aa2 | Methacrylic acid/methyl methacryllate copolymer repeating unit by molar ratio 70/30 repeating unit by mass ratio 67/33 | Methacrylic acid/methyl methacrylate were polymerized using V601 from Wako Pure Chemical Industries Ltd. as an initiator. | 5.7 | Mw = 12300, Dispersion 2.1 |
| Ab1 | Dipentaerythritol hexaacrylate | KAYARAD DPHA from Nippon Kayaku Co. Ltd. | 5.0 | 579 |
| Aab1 | 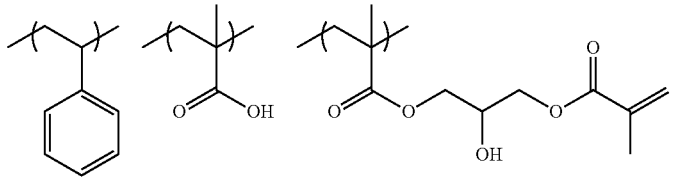<br>Repeating unit by molar ratio 40/30/30<br>Repeating unit by mass ratio 31/19/50 | Styrene/methacrylic acid copolymer was reacted with glycidyl methacrylate. | 4.4 | Mw = 13100, Dispersion 2.1 |
| Aab2 | 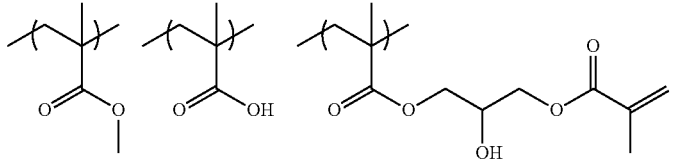<br>Repeating unit by molar ratio 40/30/30<br>Repeating unit by mass ratio 23/26/51 | Synthesized by reacting glycidyl methacrylate with Aa2. | 5.3 | Mw = 13400, Dispersion 2.1 |
| Aab3 | 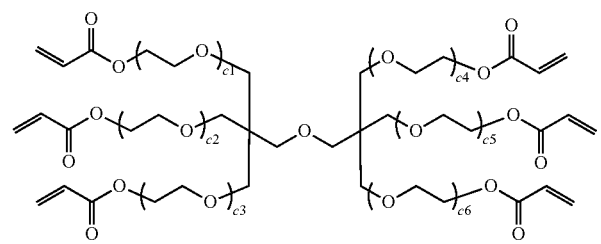<br>c1 + c2 + c3 + c4 + c5 + c6 = 12 | NK Ester A-DPH-12E from Shin-Nakamura Chemical Co. Ltd. | 5.9 | 1107 |

TABLE 1-continued

| Compound (A) of invention | Availability | Equation (1) | Molecular weight |
|---|---|---|---|
| Aab4 | PVEEA from Nippon Shokubai Co. Ltd. | 5.4 | Mw = 21300, Dispersion 2.2 |
| Aab5 | NK Ester 600 from Shin-Nakamura Chemical Co. Ltd. | 6.6 | 708 |
| Aab6 | U-4HA from Shin-Nakamura Chemical Co. Ltd. | 5.1 | 596 |
| Aab7 | Synthesized by adding glycidyl methacrylate to copolymer of acryllonitrile and methacrylic acid. | 4.9 | Mw = 15200 Dispersion 2.2 |

Aab5: c8 = ca. 14

Aab7: Repeating unit by molar ratio 40/30/30
Repeating unit by mass ratio 18/22/59

TABLE 2

| Compound (A) of invention | Availability | Equation (1) | Molecular weight |
|---|---|---|---|
| Aab8 | Synthesized by adding glycidyl methacrylate to copolymer of acryiamide and methacrylic acid. | 5.4 | Mw = 14700 Dispersion 2.3 |

Repeating unit by molar ratio 40/30/30
Repeating unit by mass ratio 23/21/56

TABLE 2-continued

| Compound (A) of invention | | Availability | Equation (1) | Molecular weight |
|---|---|---|---|---|
| Aab9 | 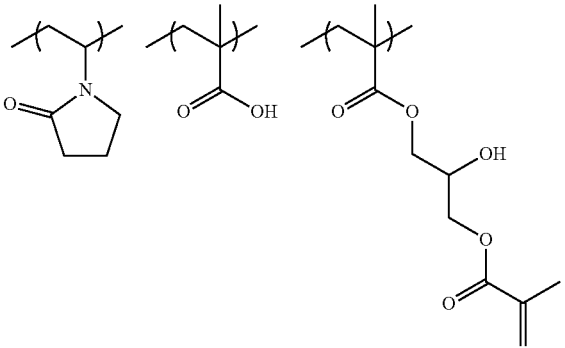<br>Repeating unit by molar ratio 40/30/30<br>Repeating unit by mass ratio 32/19/49 | Synthesized by adding glycidyl methacrylate to copolymer of N-vinylpyrrolidone and methacrylic acid. | 4.8 | Mw = 13800 Dispersion 2.3 |
| Aab10 | 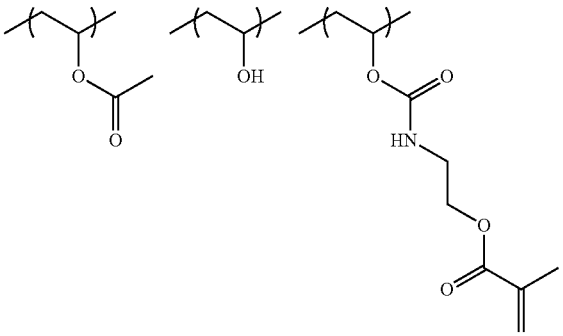<br>Repeating unit by molar ratio 12/85/3<br>Repeating unit by mass ratio 19/70/11 | Synthesized by adding Karenz MOI to PVA (degree of saponification: 88 mol %) catalyzed by dibutyl tin dilaurate. | 6.4 | Mw = 15000 |
| Aab11 | 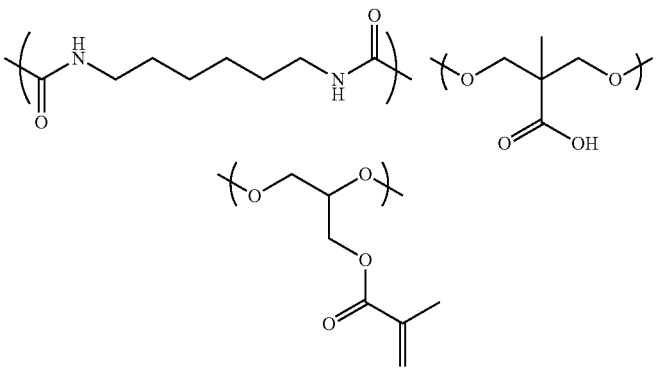<br>Repeating unit by molar ratio 50/20/30<br>Repeating unit by mass ratio 52/17/30 | Synthesized by allowing polyaddition to proceed among hexamethylene diisocyanate, dimethylolpropionic acid and glycerin monomethacrylate, catalyzed by dibutyl tin dilaurate. | 7.6 | Mw = 17300 |

TABLE 2-continued

| | Compound (A) of invention | Availability | Equation (1) | Molecular weight |
|---|---|---|---|---|
| Comparative 1 | [Chemical structure: methacrylate/styrenecarboxylic acid/glycidyl methacrylate-reacted copolymer] Repeating unit by molar ratio 40/30/30; Repeating unit by mass ratio 23/26/51 | Glycidyl methacrylate was reacted on methyl methacrylate/styrenecarboxylic acid copolymer. | 3.7 | Mw = 13800, Dispersion 2.0 |
| Comparative 2 | [Chemical structure] Average m + n = 4; Average n/(m + n) = 0.5 | NK Oligo EA-7140/PGMAc from Shin-Nakamura Chemical Co. Ltd. | 3.5 | 1780 |
| Comparative 3 | [Chemical structure] | NK Ester CBX-0 from Shin-Nakamura Chemical Co. Ltd. | 6.3 | 398 |

TABLE 3

| | Underlay 1 | Underlay 2 | Underlay 3 | Underlay 4 | Underlay 5 | Underlay 6 | Underlay 7 | Underlay 8 | Underlay 9 |
|---|---|---|---|---|---|---|---|---|---|
| Aa1 | 10 | | | | | | | | |
| Aa2 | | 30 | | | | | 20 | | |
| Ab1 | | 70 | | | | | | | |
| Aab1 | | | 90 | | | | | 50 | 30 |
| Aab2 | | | 10 | 100 | | | | | |
| Aab3 | | | | | 100 | | | | |
| Aab4 | 90 | | | | | 70 | | | |
| Aab5 | | | | | | 30 | | | |
| Aab6 | | | | | | | 80 | | |
| Aab7 | | | | | | | | | |
| Aab8 | | | | | | | | | |
| Aab9 | | | | | | | | | |
| Aab10 | | | | | | | | | |
| Aab11 | | | | | | | | | |
| Comparative 1 | | | | | | | | 50 | 70 |
| Comparative 2 | | | | | | | | | |
| Comparative 3 | | | | | | | | | |
| Equation (1) Value of Composition | 5.6 | 5.2 | 4.5 | 5.3 | 5.9 | 5.8 | 5.2 | 4.1 | 3.9 |

TABLE 3-continued

| | Underlay 10 | Underlay 11 | Underlay 12 | Underlay 13 | Underlay 14 | Underlay 15 | Underlay 16 | Underlay 17 | Underlay 18 |
|---|---|---|---|---|---|---|---|---|---|
| Aa1 | | | | | | | | | |
| Aa2 | | | | | | | | | |
| Ab1 | | | | | | | | | |
| Aab1 | | | | | | | | | |
| Aab2 | | | | | | | | | |
| Aab3 | | | | | | | | | |
| Aab4 | 70 | | | | | | | | |
| Aab5 | | | | | | | | | |
| Aab6 | | | | | | | | | |
| Aab7 | | | | | 100 | | | | |
| Aab8 | | | | | | 100 | | | |
| Aab9 | | | | | | | 100 | | |
| Aab10 | | | | | | | | 100 | |
| Aab11 | | | | | | | | | 100 |
| Comparative 1 | | 100 | | | | | | | |
| Comparative 2 | | | 100 | | | | | | |
| Comparative 3 | 30 | | | 100 | | | | | |
| Equation (1) Value of Composition | 5.7 | 3.7 | 3.5 | 6.3 | 4.9 | 5.4 | 4.8 | 6.4 | 7.6 |

(Preparation of Curable Composition for Imprints)

Polymerizable monomers, polymerization initiators and additives listed in Table below were mixed, each of the mixtures was further added with 4-hydroxy-2,2,6,6-tetramethylpiperidine-1-oxyl, free radical (from Tokyo Chemical Industry Co. Ltd.) as a polymerization inhibitor, so as to adjust the content thereof to 200 ppm (0.02% by mass) relative to the polymerizable monomer. Each of the mixture was filtered through a tetrafluoroethylene filter with a pore size of 0.1 μm, to thereby prepare a curable composition for imprints. Contents in Table are given in parts by mass.

For the cases where two or more species of polymerizable compound were used, "equation (1) value of polymerizable compound" in Table 4 is given by a sum of products of the respective values of (Equation 1) and mass fraction of the individual polymerizable compounds.

TABLE 4

| | A1 | A2 | A3 | A4 | A5 | A6 |
|---|---|---|---|---|---|---|
| R-1 | 50 | | | | | |
| R-2 | | | | 50 | | |
| R-3 | | | 100 | 49.5 | | 50 |
| R-4 | | 50 | | | | |
| R-5 | 49 | 50 | | | | |
| R-6 | | | | | 100 | 50 |
| R-7 | 1 | | | 0.5 | | |
| Equation (1) Value of Polymerizable Compound | 3.1 | 3.2 | 3.2 | 2.8 | 4.4 | 3.8 |
| P-1 | 2 | 2 | | | 3 | 3 |
| P-2 | | | 3 | 3 | | |
| X1 | 1 | 1 | 1 | | 1 | 1 |
| X2 | | | 2 | 2 | | |

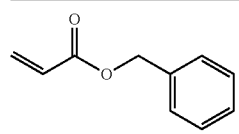

R-1

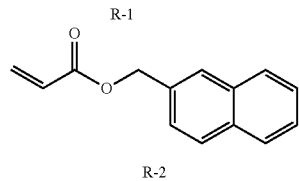

R-2

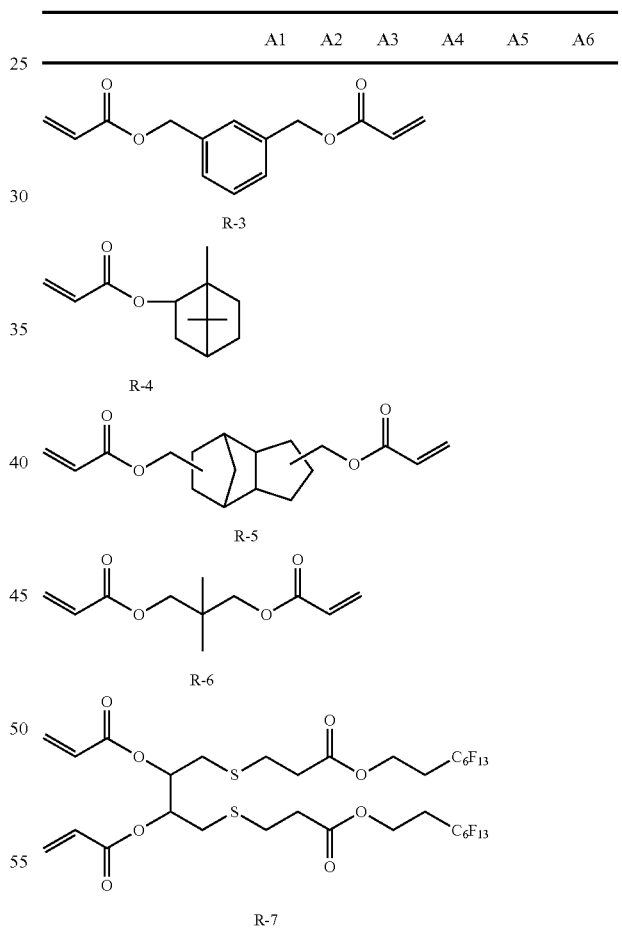

R-3

R-4

R-5

R-6

R-7

TABLE 5

| | | Value of Equation (1) |
|---|---|---|
| R-1 | Benzyl acrylate (Biscoat #160, from Osaka Organic Chemical Industry Ltd.) | 2.8 |

TABLE 5-continued

| | | Value of Equation (1) |
|---|---|---|
| R-2 | Synthesized from 2-bromomethylnaphthalene and acrylic acid by general method | 2.3 |
| R-3 | Synthesized from α,α'-dichloro-m-xylylene and acrylic acid by general method | 3.2 |
| R-4 | IBXA from Osaka Organic Chemical Industry, Ltd. | 3.2 |
| R-5 | A-DCP, from Shin-Nakamura Chemical Co. Ltd. | 3.3 |
| R-6 | A-NPG, from Shin-Nakamura Chemical Co. Ltd. | 4.4 |
| R-7 | Synthesized by the method described in JP-A-2010-239121 | 4.0 |

<Photo-Polymerization Initiator>
P-1: 2-hydroxy-2-methyl-1-phenyl-1-propan-1-one (Darocur 1173, from BASF GmbH)
P-2: 2-(dimethylamino)-2-(4-methylbenzyl)-1-[4-(morpholin-4-yl)phenyl]butan-1-one (Irgacure 379EG, from BASF GmbH)
<Additives>
X1: PF-636 (fluorine-containing surfactant, from Omnova Solutions, Inc.)
X2: polypropylene glycol, from Wako Pure Chemical Industries, Ltd.
<Pattern Formation Method>

A mold used herein was a quartz mold having a rectangular line/space pattern (1/1) with a line width of 60 nm, a trench depth of 100 nm, and a line edge roughness of 3.5 nm.

On the thus-obtained underlay film, the photocurable composition for imprints was discharged using an ink jet printer DMP-2831 from Fujifilm Dimatix Inc., with a volume of droplet per nozzle of 1 pl, while adjusting pitch of dots so as to give a thickness of residual film in the resultant pattern of 15 nm, and while controlling discharge timing so as to align the dots in a square matrix of approximately 100 μm pitch. Temperature of the curable composition discharged in this process was adjusted to 25° C. A mold was placed on the photocurable composition under nitrogen gas flow so as to allow the curable composition to fill therein, light was irradiated from the mold side using a mercury lamp with an energy of 300 mJ/cm$^2$, and the mold was separated after the irradiation, to thereby obtain a pattern.

The thus-obtained pattern was processed by RIE using an argon/oxygen mixed gas so as to remove the residual film in the recessed portion and the underlay film. Conditions of the etching were adjusted so that the residual film in the recessed portion and the underlay film may completely be removed so as to expose the substrate. The silicon substrate was further processed by RIE in an argon/CHF$_3$ mixed gas system, to thereby obtain a processed silicon substrate.
<Pattern Geometry>

Geometry of the obtained silicon pattern were observed under a scanning electron microscope.
A: Good rectangular pattern obtained.
B: Pattern rounded at the top.
C: Pattern rounded at the top, and tapered.
<Line Edge Roughness of Silicon Pattern after Etching>

Deflection of the edge from a designed reference line was measured at 15 points using a critical dimension SEM over a 5 μm range of the edge of the line pattern in the longitudinal direction thereof, a standard deviation was determined, and 3σ was estimated. The smaller the value, the better the line edge roughness. A difference of 0.1 nm is considered as significant. A sample causing adhesion of a part of pattern onto the mold was denoted by *, and a portion where an accurate pattern was obtained was evaluated. A sample causing adhesion of most part of pattern onto the mold, and could not therefore evaluated, was denoted by **.

TABLE 6

| | Underlay film | Curable Composition | Geometry | Line Edge Roughness |
|---|---|---|---|---|
| Example 1 | Underlay 1 | A1 | A | 3.9 |
| Example 2 | Underlay 2 | A2 | A | 3.9 |
| Example 3 | Underlay 1 | A3 | A | 3.7 |
| Example 4 | Underlay 2 | A3 | A | 3.8 |
| Example 5 | Underlay 3 | A3 | A | 4.0 |
| Example 6 | Underlay 4 | A3 | A | 3.8 |
| Example 7 | Underlay 5 | A3 | A | 3.7 |
| Example 8 | Underlay 6 | A3 | A | 3.8 |
| Example 9 | Underlay 7 | A3 | A | 3.8 |
| Example 10 | Underlay 8 | A3 | A | 4.2 |
| Example 11 | Underlay 9 | A3 | B | 4.3 |
| Example 12 | Underlay 6 | A4 | A | 3.6 |
| Example 13 | Underlay 8 | A5 | B | 4.4 |
| Example 14 | Underlay 8 | A6 | A | 4.3 |
| Example 15 | Underlay 9 | A5 | B | 4.8 |
| Example 16 | Underlay 9 | A6 | A | 4.7 |
| Example 17 | Underlay 10 | A3 | A | 4.0 |
| Example 18 | Underlay 14 | A3 | A | 3.9 |
| Example 19 | Underlay 15 | A3 | A | 3.7 |
| Example 20 | Underlay 16 | A3 | A | 4.0 |
| Example 21 | Underlay 17 | A3 | A | 3.6 |
| Example 22 | Underlay 18 | A3 | B | 4.1 |
| Comparative Example 1 | Underlay 11 | A3 | B | 5.1 |
| Comparative Example 2 | Underlay 12 | A3 | C | 6.4 |
| Comparative Example 3 | Underlay 12 | A5 | C | 7.4 |
| Comparative Example 4 | Underlay 13 | A3 | *B | *4.2 |
| Comparative Example 5 | — | A3 | ** | ** |

When the silicon substrate was processed similarly to the Examples, except that the underlay film composition was added with 0.5% by mass of Irgacure 379EG (from BASF GmbH) as a photo-polymerization initiator, relative to the components excluding the solvent, and that the underlay film composition was cured by irradiating light of 365 nm with an energy of 100 mJ/cm$^2$, rather than by heating at 220° C., the obtained pattern was found to be square and small in the line edge roughness, similarly to the case where the underlay film compositions were cured by heating without being added with the photo-polymerization initiator.

When the silicon substrate was processed similarly to the Examples, except that the underlay film composition was added with 0.5% by mass of VR-110 (from Wako Pure Chemical Industries, Ltd.) as a thermal polymerization initiator, relative to the components excluding the solvent, the obtained pattern was found to be square and small in the line edge roughness, similarly to the case where the underlay film compositions were cured by heating without being added with the thermal polymerization initiator.

When the pattern formation and etching were conducted similarly to the Examples using the compositions in Examples, except that a quartz substrate was used as the substrate, and when the quartz substrate was processed, the obtained pattern was found to be square and small in the line edge roughness, similarly to the silicon substrate. It was confirmed that the composition of the present invention also expressed a good performance also in an application of manufacturing a quartz mold.

As is clear from Tables in the above, it was found that, by using the underlay film composition of the present invention, a good pattern geometry of the curable composition for imprints formed thereon may be obtained, and a good line edge roughness may be achieved as a consequence.

It was also found that, by using the underlay film composition of the present invention having no aromatic group, a more better line edge roughness may be achieved. It was furthermore found that, by using the curable composition for imprints which contains a polymerizable compound having an aromatic group or an alicyclic hydrocarbon group, in combination with the underlay film composition, the pattern geometry and the line edge roughness were furthermore improved.

The present disclosure relates to the subject matter contained in Japanese Patent Application No. 223031/2011 filed on Oct. 7, 2011, U.S. Patent Application No. 61/544,806, filed on Oct. 7, 2011, and Japanese Patent Application No. 193857/2012 filed on Sep. 4, 2012, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. An underlay film composition for imprints comprising a compound (A) and a solvent (B), the compound (A) having at least either one of a group (Ka) capable of covalently bonding and/or interacting with a substrate, and, a group (Kb) capable of covalently bonding and/or interacting with a curable composition for imprints, an Ohnishi parameter (Z) calculated from (equation 1) of 3.8 or larger, and a molecular weight of 400 or larger:

the Ohnishi parameter=(total number of atoms)/
 (number of carbon atoms−number of oxygen
 atoms). (Equation 1)

2. The underlay film composition for imprints of claim 1, wherein the ratio of a sum (Za) of products of the Ohnishi parameters of the individual components and the mass fractions thereof, with respect to the whole components excluding the solvent (B), is 3.8 or larger.

3. The underlay film composition for imprints of claim 1, wherein the underlay film composition for imprints contains a compound (Aa) having a group (Ka) capable of covalently bonding and/or interacting with the substrate, and a compound (Ab) having a group (Kb) capable of covalently bonding and/or interacting with the curable composition for imprints; or contains a compound (Aab) having a group (Ka) capable of covalently bonding and/or interacting with the substrate, and having a group (Kb) capable of covalently bonding and/or interacting with the curable composition for imprints.

4. The underlay film composition for imprints of claim 1, wherein the compound (A) is a polymer having a molecular weight of 3000 or larger.

5. The underlay film composition for imprints of claim 1, wherein the compound (A) is an addition polymerization-type polymer having a molecular weight of 3000 or larger.

6. The underlay film composition for imprints of claim 1, wherein the group (Kb) capable of covalently bonding and/or interacting with the curable composition for imprints, bound to the compound (A), is a (meth)acryloyl group.

7. The underlay film composition for imprints of claim 1, wherein the group (Ka) capable of covalently bonding and/or interacting with the substrate, bound to the compound (A), is selected from carboxyl group, hydroxy group and ether group.

8. The underlay film composition for imprints of claim 1, wherein the compound (A) has substantially no aromatic group.

9. The underlay film composition for imprints of claim 1, wherein the underlay film composition for imprints is substantially composed of the compound (A) and the solvent (B) only.

10. The underlay film composition for imprints of claim 1, wherein the curable composition for imprints contains a polymerizable compound (C), and the Ohnishi parameter (Y) of the polymerizable compound (C) and the Ohnishi parameter (Z) of the compound (A) satisfy (Y)≤(Z).

11. The underlay film composition for imprints of claim 1, wherein the curable composition for imprints contains a polymerizable compound (C), and the Ohnishi parameter (Y) of the polymerizable compound, and a sum (Za) of products of the Ohnishi parameters of the individual components and the mass fraction thereof, with respect to the whole components excluding the solvent of the underlay film composition for imprints, satisfy (Y)≤(Za).

* * * * *